United States Patent
Furutani et al.

(10) Patent No.: US 6,490,221 B2
(45) Date of Patent: Dec. 3, 2002

(54) SEMICONDUCTOR MEMORY DEVICE WITH LOW POWER CONSUMPTION

(75) Inventors: Kiyohiro Furutani, Hyogo (JP); Mikio Asakura, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/933,667

(22) Filed: Aug. 22, 2001

(65) Prior Publication Data
US 2002/0118590 A1 Aug. 29, 2002

(30) Foreign Application Priority Data
Feb. 26, 2001 (JP) .................................. 2001-049940 (P)

(51) Int. Cl.[7] .................................................. G11C 7/00
(52) U.S. Cl. ........................... 365/230.03; 365/230.06; 365/200; 365/230.01; 365/203; 365/204; 365/226
(58) Field of Search .................... 365/230.01, 230.03, 365/230.06, 200, 203, 204, 226

(56) References Cited

U.S. PATENT DOCUMENTS

| 5,748,534 A | * | 5/1998 | Dunlap et al. | ......... 365/185.21 |
| 5,881,014 A | * | 3/1999 | Ooishi | ...................... 365/226 |
| 6,088,286 A | * | 7/2000 | Yamauchi et al. | ..... 365/230.06 |
| 6,373,746 B1 | * | 4/2002 | Takeuchi et al. | ....... 365/185.03 |
| 2001/0003509 A1 | * | 6/2001 | Hosono et al. | ........ 365/185.05 |

FOREIGN PATENT DOCUMENTS

| JP | 2000-67595 | | 3/2000 |
| JP | 02000260199 A | * | 9/2000 |

* cited by examiner

Primary Examiner—Viet Q. Nguyen
(74) Attorney, Agent, or Firm—McDermott, Will & Emery

(57) ABSTRACT

A semiconductor memory device includes: a memory cell region constructed of blocks and a memory cell region constructed of blocks. The blocks and the blocks are continuously disposed. A block decoder outputs block select signals to the respective blocks. As a result, power consumption of the semiconductor memory device is reduced.

6 Claims, 18 Drawing Sheets

FIG.5
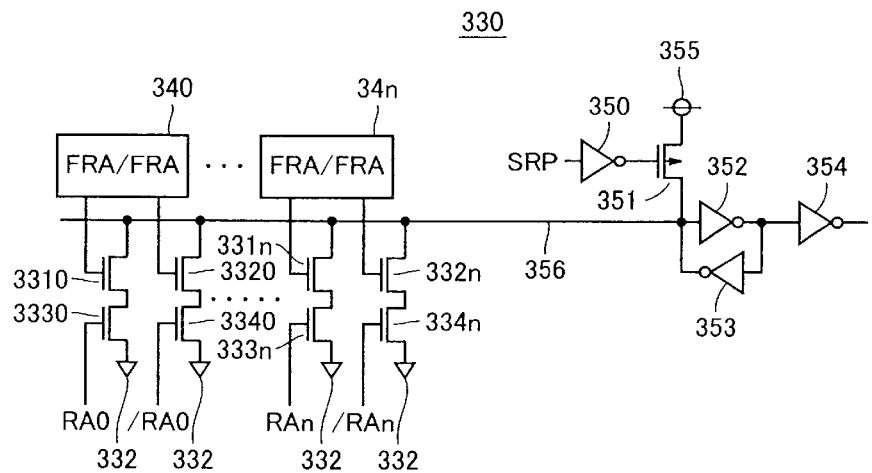
FIG.6
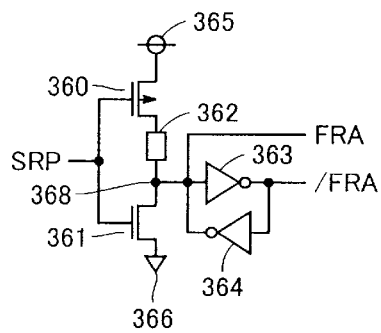
FIG.7
|  | R12 | R11 | R10 | R9 |
|---|---|---|---|---|
| Gr1 | 0 | 0 | 0 | 0 |
|  | 0 | 0 | 0 | 1 |
|  | 0 | 0 | 1 | 0 |
|  | 0 | 0 | 1 | 1 |
|  | 0 | 1 | 0 | 0 |
|  | 0 | 1 | 0 | 1 |
|  | 0 | 1 | 1 | 0 |
|  | 0 | 1 | 1 | 1 |
| Gr2 | 1 | 0 | 0 | 0 |
|  | 1 | 0 | 0 | 1 |
|  | 1 | 0 | 1 | 0 |
|  | 1 | 0 | 1 | 1 |
|  | 1 | 1 | 0 | 0 |
|  | 1 | 1 | 0 | 1 |
|  | 1 | 1 | 1 | 0 |
|  | 1 | 1 | 1 | 1 |

132A

132B

SEMICONDUCTOR MEMORY DEVICE WITH LOW POWER CONSUMPTION

BACKGROUND OF THE INVENTION

1. Field of the Invention

The present invention relates to a semiconductor memory device capable of reducing power consumption or to a semiconductor memory device capable of performing a high speed burn-in test.

2. Description of the Background Art

In a prior art DRAM (Dynamic Random Access Memory), a shared sense amplifier configuration is adopted in which sense amplifiers are each shared by adjacent memory cell arrays on both sides thereof as shown in FIG. 21. Referring to FIG. 21, a memory cell array MCAL includes: a plurality of memory cells MCL1 and MCL2; a bit line pair BLL and /BLL; and word lines WL0L and WL1L. The memory cells MCL1 and MCL2 are each constructed of an N channel MOS transistor 151 and a capacitor 152. The source terminal of the N channel MOS transistor 151 is connected to the bit line BLL or /BLL, the gate terminal thereof is connected to the word line WL0L or WL1L and the drain terminal is connected to one electrode of the capacitor 152. The capacitor 152 is provided between the N channel MOS transistor 151 and a terminal 153 and the other electrode (a cell plate electrode) of the capacitor 152 is connected to the terminal 153. A cell plate voltage Vcp of about half a power source voltage Vcc is supplied to the terminal 153.

When a high boosted voltage Vpp higher than the power source voltage Vcc is supplied, the word line WL0L or WL1L is activated to turn on the N channel MOS transistor 151. By doing so, one electrode of the capacitor 152 is connected to the bit line BLL or /BLL, and an electric charge is supplied to the one electrode of the capacitor 152 from the bit line BLL or /BLL to perform data write, or alternatively an electric charge flows out from the one electrode of the electrode to the bit line BLL or /BLL to perform data read. Hence, the N channel MOS transistor 151 is an access transistor for access to the capacitor 152 in performing data write or data read.

A bit line equalize circuit 160L is constructed of N channel MOS transistors 161 to 163. The N channel MOS transistors 161 and 162 are connected in series between the bit line BLL and /BLL, the N channel MOS transistor 163 is connected between the bit lines BLL and /BLL. The N channel MOS transistors 161 to 163 receive a bit line equalize signal BLEQL at each of the gate terminals thereof. When the bit line equalize signal BLEQL is activated, the N channel MOS transistors 161 to 163 are turned on and an intermediate voltage VH supplied to a node 164 between the N channel MOS transistors 161 and 162 is supplied to the bit lines BLL and /BLL to equalize the bit line pair BLL and /BLL to a prescribed voltage. In this case, the N channel MOS transistor 163 exerts a function to equalize a potential on the bit line BLL and a potential on the bit line /BLL.

N channel MOS transistors 190L and 191L are both connected between the bit line equalize circuit 160L and a sense amplifier 170 in series with the respective bit lines BLL and /BLL. The N channel MOS transistors 190L and 191L are turned on/off by a bit line select signal BLIL to connect the bit line equalize circuit 160L and the sense amplifier 170 together.

The sense amplifier 170 is constructed of P channel MOS transistors 171 to 173; and N channel MOS transistors 174 to 176. The P channel MOS transistors 172 and 173 are connected in series between the bit lines BLL and /BLL and the N channel MOS transistors 174 and 175 are also connected in series therebetween. The P channel MOS transistor 171 is connected between a power source node 177 and a node 179A and receives a sense amplifier activating signal SEP at its gate. The N channel MOS transistor 176 is connected between a node 179B and a ground node 178 and receives a sense amplifier activating signal SEN. The sense amplifier 170 differentially amplifies a potential difference between the bit lines BLL and /BLL.

An IO gate circuit 180 is constructed of N channel MOS transistors 181 and 182. The N channel MOS transistor 181 connects the bit line BLL and an input/output line IO together and the N channel MOS transistor 182 connects the bit line /BLL and an input/output line /IO together. The N channel MOS transistors 181 and 182 are turned on/off by a column select signal SCL supplied from a terminal 183.

N channel MOS transistors 190R and 191R are both connected between the bit line equalize circuit 160R and the sense amplifier 170 in series with the respective bit lines BLL and /BLL. N channel MOS transistors 190R and 191R are turned on/off by a bit line select signal BLIR to connect the bit line equalize circuit 160R and the sense amplifier 170 together.

The bit line equalize circuit 160R has the same configuration as does the bit line equalize circuit 160L and is activated/deactivated by a bit line equalize signal BLEQR.

A memory cell array MCAR includes memory cells MCR1 and MCR2, a bit line pair BLR and /BLR and word lines WL0R and WL1R. Memory cells MCR1 and MCR2 have the same configuration as do the memory cell MCL1 and MCL2.

In the configuration shown in FIG. 21, when data is inputted/outputted to/from the memory cells MCL1 and MCL2 of the memory cell array MCAL, the N channel MOS transistors 190R and 191R are turned off by the bit line select signal BLIR while the N channel MOS transistors 190L and 191L are turned on by the bit line select signal BLIL. Then, the N channel MOS transistors 181 and 182 are turned on by the activated column select signal SCL and the bit lines BLL and /BLL are connected to the respective input/output lines IO and /IO by the IO gate circuit 180. Further, the power source voltage and the ground voltage are supplied by the respective sense amplifier activating signals SEP and SEN to activate the sense amplifier 170. In a standby state, the bit line equalize signal BLEQL is activated and the bit line pair BLL and /BLL are equalized to a precharge voltage. Thereafter, when a memory cycle gets started, the bit line equalize signal BLEQL is deactivated. Subsequent to the deactivation, the word lines WL0L and WL1L are activated to input/output data to/from the memory cells MCL1 and MCL2. When data input/output finishes, the bit line equalize signal BLEQL is activated to equalize the bit line pair BLL and /BLL to the precharge potential.

Then, when data is inputted/outputted to/from the memory cells MCR1 and MCR2 of the memory cell array MCAR, the N channel MOS transistors 190L and 191L are turned off by the bit line select signal BLIL, while the N channel MOS transistors 190R and 191R are turned on by the bit line select signal BLIR. The N channel MOS transistors 181 and 182 are turned on by an activated column select signal SCL and the bit lines BLR and /BLR are connected to the respective input/output lines IO and /IO by the IO gate circuit 180. Further, the power source voltage and the ground voltage are supplied by the respective sense amplifier activating signals SEP and SEN to activate the sense amplifier 170. In the standby state, the bit line equalize signal BLEQR is activated to equalize the bit line pair BLR and /BLR to the precharge voltage. Thereafter, when a memory cycle gets started, the bit line equalize signal BLEQR is deactivated. Subsequent to this deactivation, the word lines WL0R and WL1R are activated to input/output data to/from the memory cells MCR1 and MCR2. When data input/output finishes, the bit line equalize signal BLEQR is activated to equalize the bit line pair BLR and /BLR to the precharge potential.

In such a way, in the configuration using shared sense amplifiers, data is alternately inputted/outputted to/from memory cell arrays on both sides of the sense amplifier.

In a highly integrated semiconductor memory device, a chip with a plurality of memory cells arranged in the form of a matrix thereon, all of which cells are in a normal state, is difficult to be fabricated; therefore, spare memory cells substituted for a defective memory cell are provided and when a defective cell is specified by an address, a spare memory cell is activated instead of the defective memory cell such that a perfect operation is realized. That is, a configuration is adopted in which an address of a defective memory cell is programmed in a chip in advance, an inputted address is compared with the programmed address and if coincidence arises, then a spared memory cell is activated.

Therefore, a prior art DRAM in which spare memory cells are arranged on a chip thereof has had a configuration shown in FIG. 22. That is, a memory cell array is constructed of a plurality of blocks BLK0 to BLK15 and shared sense amplifiers 170 are each inserted between adjacent blocks. Each of the plurality of blocks BLK0 to BLK15 includes: spare rows activated/deactivated by a spare row decoder 192; and regular rows activated/deactivated by a regular row decoder 193. When a defective memory cell is included in memory cells connected to a regular row, a memory cell in a spare row is activated instead of the defective row by the spare row decoder 192. In the configuration shown in FIG. 22, however, since the plurality of blocks BLK0 to BLK15 each have spare rows and regular rows, the number of spare rows increases on the chip as a whole, thereby having led to a problem of being unsuitable for high integration.

Therefore, a semiconductor memory device of a configuration as shown in FIG. 23 is disclosed in Japanese Patent Laying-Open No. 2000-67595. That is, referring to FIG. 23, of the plurality of blocks BLK0 to BLK15, the blocks BLK0 and BLK15 each include: spare rows activated/deactivated by a spare decoder 194; and regular rows activated/deactivated by a regular row decoder 195, while the blocks BLK1 to BLK14 each include only regular rows activated/deactivated by the regular row decoder 195. With such a configuration adopted, the spare rows can be concentrated in the two blocks BLK0 and BLK15, thereby enabling the number of spare rows to decreases on a chip as a whole. When each of the plurality of blocks BLK0 to BLK15 is accessed, the plurality of blocks BLK0 to BLK15 are divided into two groups and access is performed to each of the two groups. That is, as shown in FIG. 24, the two groups are formed by division as a group Gr1 including the blocks BLK0, BLK2, BLK4, BLK6, BLK8, BLK10, BLK12 and BLK14 and a group Gr2 including BLK1, BLK3, BLK5, BLK7, BLK9, BLK11, BLK13 and BLK15. Further, spare memory cells substituted for a memory cell included in the group Gr1 are disposed in the block BLK0 and spare memory cells substituted for a memory cell included in the group Gr2 are disposed in the block BLK15. When a memory cell included in the group Gr1 is defective, a spare row 230 of the block BLK0 is activated, while when a memory cell included in the group Gr2 is defective, a spare row 231 of the block BLK15 is activated.

When a defective memory cell exists in the block BLK14 included in the group Gr1 and the defective memory cell is specified by an address, however, redundancy judgment is performed on whether or not the defective memory cell is a memory cell that can be replaced with a spare memory cell included in the block BLK0. In the two blocks BLK0 and BLK14, the bit line select signal BLI is activated to connect the bit line pair and the sense amplifier together and the bit line equalize signal BLEQ is activated to equalize the bit line pair to the precharge voltage till the redundancy judgment finishes. Thereafter, the bit line select signal BLI and the bit line equalize signal BLEQ are deactivated to make preparation for activation of a word line.

When a memory cell in the block BLK0 is used instead of a memory cell in the block BLK14 as a result of redundancy judgment, it is required that the bit line select signal BLI and the bit line equalize signal BLEQ are again activated in the block BLK14. Since the blocks BLK0 and BLK14 are spaced apart from each other, a signal for deactivating the block BLK14 is delayed due to propagation delay. As a result, a time period is extended in which the bit line select signal BLI and the bit line equalize signal BLEQ are inactive; therefore, a problem has arisen since a discharge amount for deactivating the bit line select signal BLI and the bit line equalize signal BLEQ increases as shown in FIG. 25. Particularly, since the bit line select signal BLI is driven by an internal high voltage generated by a built-in pump circuit on a chip, increase in power consumption caused by increase in discharge amount is a conspicuous problem. In company with this, a necessity arises for the pump circuit of a larger capacity, having led to a problem of a larger chip area.

On the other hand, as shown in FIG. 26A, a prior art semiconductor memory device 300 includes a memory cell array divided into 4 groups Gr0 to Gr3. The groups Gr0 to Gr3 each include spare rows 301 and regular rows 302. Column redundancy judgment on a memory cell included in the groups Gr0 and Gr1 is performed by one comparison circuit and column redundancy judgment on a memory cell included in the groups Gr2 and Gr3 is performed by another comparison circuit. In order to perform a burn-in test in which a high voltage is applied at a high temperature of the order of 120° C. in the semiconductor memory device 300, the groups Gr0 and Gr2 are simultaneously activated and the groups Gr1 and Gr3 are simultaneously activated. Therefore, a column address for specifying a column 303 is inputted and comparison can be made of the column address with a column address programmed in a redundancy circuit.

The semiconductor memory device 300, however, includes spare rows 301 in each of the groups Gr0 to Gr3; therefore, a substitution capability to substitute a spare memory cell for a defective memory cell is low in the groups Gr0 to Gr3. Hence, a semiconductor memory device 400 as shown in FIG. 26B has been proposed. The semiconductor memory device 400 includes a memory cell divided into two groups Gr0 and Gr1. Each of the groups Gr0 and Gr1 includes spare rows 401 and regular rows 402. Furthermore, column redundancy judgment on memory cells included in the groups Gr0 and Gr1 is performed by one comparison circuit. With such a configuration, the groups Gr0 and Gr1 are simultaneously activated in a burn-in test; therefore, when a column address specifying a column 403 is inputted, the column address inputted cannot be compared with a column address programmed in a redundancy circuit. That is, since the inputted column address is in common with the groups Gr0 and Gr1, no judgment can be made on whether a column address of the group Gr0 or the group Gr1 coincides with a programmed column even if the inputted column address coincides with the programmed column address. As a result, a problem has arisen since no burn-in test can be performed on a semiconductor memory device having an increased substitution capability.

SUMMARY OF THE INVENTION

It is accordingly an object of the present invention to provide a semiconductor memory device with low power consumption.

It is another object of the present invention to provide a semiconductor memory device capable of simultaneously activating a plurality of groups to perform a burn-in test.

A semiconductor memory device according to the present invention is a semiconductor memory device having a plurality of regions and each of the plurality of regions includes: a plurality of memory cell regions each including a first block including substitution rows on which first memory cells are arranged in a row direction and regular rows on which second memory cells are arranged in a row direction, and a plurality of second blocks each including regular rows without any substitution row; a plurality of redundancy circuits provided correspondingly to the respective plurality of memory cell regions and each comparing a row address of a defective memory cell with an inputted row address to output a substitution row select signal indicating the presence or absence of selection of a substitution row on the basis of a result of the comparison; a block decoder receiving the substitution row select signal to generate a block select signal for selectively activating/deactivating a first block and a plurality of second blocks included in a memory cell region corresponding to a redundancy circuit outputting the substitution row select signal received on the basis of the substitution row select signal and output the block select signal that the block decoder has generated to the first block and the plurality of second block included in the corresponding memory cell region; and a plurality of bit line equalize circuits provided correspondingly to respective plural first and second blocks included in the plurality of memory cell regions and each generating a bit line equalize signal equalizing a bit line pair included in first and second blocks, wherein the first memory cells each are a memory cell substituted for a defective memory cell among a plurality of second memory cells included in the first block and the plurality of second blocks, a plurality of second blocks in one of a plurality of memory cell regions are continuously disposed, and each of the plurality of bit line equalize circuits activates a bit line equalize signal in response to deactivation of a block select signal.

A semiconductor memory device according to the present invention includes a plurality of regions. Each of the plurality of regions includes: a plurality of memory cell regions; a plurality of redundancy circuits; a block decoder; and a plurality of a bit line equalize circuits. The plurality of memory cell regions each includes a first block and a plurality of second blocks. The plurality of second blocks are continuously disposed. The block decoder outputs a block signal for selecting a plurality of blocks to the first block and the plurality of second block included in each of a plurality of memory cell regions. Each of a plurality of bit line equalize circuits activates a bit line equalize signal in response to deactivation of the block select signal. Thereby, a plurality of second blocks receive a block select signal with reduced propagation delay. Therefore, according to the present invention, a timing of activation of an inactive bit line equalize signal can be almost the same for each of a plurality of second blocks. As a result, a discharge amount when a bit line equalize signal is deactivated is reduced, thereby enabling realization of a semiconductor memory device with low power consumption.

It is preferable that each of the plurality of memory cell regions further includes: a third block disposed between the first block and the plurality of second blocks; a plurality of sense amplifiers each selectively amplifying read data from two adjacent blocks, wherein the third block is a first or second block constituting another memory cell region.

A first block and a second block including substitution rows are simultaneously activated in one memory cell region. Therefore, according to the present invention, first and second blocks are kept active till a comparison period between a row address of a defective memory cell and an inputted row address ends and after the comparison period ends, one of the two blocks that have been activated continues to be active, thereby enabling high speed operation of a semiconductor memory device to be realized.

It is preferable that each of the plurality of redundancy circuits of the semiconductor memory device further generates a substitution row activating signal for activating/deactivating a substitution row on the basis of a result of the comparison and each of the plurality of regions further includes: a plurality of substitution row decoders provided correspondingly to the respective plurality of memory cell regions and each activating/deactivating a substitution row in response to a substitution row activating signal.

A substitution row decoder performs activation of a substitution row in response to a substitution row activating signal from a redundancy circuit. Therefore, according to the present invention, a block including substitution rows can be activated at almost the same timing that a block including no substitution row can be activated according to a block select signal with reduced propagation delay and a substitution row included in the block can also be activated.

It is preferable that a block decoder outputs a first block select signal activating a first block and a second block select signal activating one of a plurality of second blocks to each of a plurality of memory cell regions till a comparison period ends in which a row address of a defective memory cell and an inputted row address are compared with each other and after the comparison period ends, outputs a third block select signal for activating one of a first block and a plurality of second blocks to each of a plurality of memory cell regions in response to a substitution row select signal.

During a period when it is judged whether or not a memory cell specified by an inputted address is a defective memory cell, a block including the memory cell specified by an inputted address and a block including a spare memory cell substituted for the memory cell specified by an inputted address if the memory cell specified by an inputted address is a defective memory cell are simultaneously activated, and after the judgment period finishes the block including the memory cell specified by an inputted address or the block including the spare memory cell continues to be kept active. Therefore, according to the present invention, a high speed semiconductor memory device can be realized.

It is preferable that the semiconductor memory device further includes: a control circuit generating an equalize control signal for controlling equalization of a bit line pair, wherein in refresh operations of a first and second memory cells, the control circuit generates an equalize control signal for deactivating a bit line equalize signal after a comparison operation performed by a redundancy circuit ends and each of a plurality of bit line equalize circuits activates/deactivates a bit line equalize signal in response to the equalize control signal.

In the semiconductor memory device, in a refresh operation of memory cells, all the blocks included in all of a plurality of memory cell regions are deactivated till a comparison period in which a row address of a defective memory cell is compared with an inputted row address ends, and after the comparison period ends, one block is activated and data is inputted/outputted to/from memory cells. Therefore, according to the present invention, power consumption is suppressed in the comparison period, and thereby a semiconductor memory device with low power consumption can be realized.

It is preferable that the control circuit of the semiconductor memory device further generates a word line control signal for activating a word line included in first and second blocks after deactivating a bit line equalize signal.

In a refresh period of memory cells, a word line included in an activated block is activated according to a row address after a comparison operation in a redundancy circuit ends. Hence, according to the present invention, power consumption of a semiconductor memory device can be surely suppressed in a refresh period of memory cells.

It is preferable that in a refresh operation of memory cells, the control circuit continues to generate an equalize control signal at a first logical level for an entire period of a comparison operation and generates an equalize control signal at a second logical level after the comparison operation ends; and each of a plurality of bit line equalize circuits generates a bit line equalize signal at the second logical level in response to the first logical level of the equalize control signal till the comparison operation ends, while generating a bit line equalize signal at the second logical level or at the first logical level in response to the second logical level of the equalize control signal and the first or second logical level of a block select signal after the comparison period ends.

The control circuit controls such that the circuit keeps blocks inactive till the comparison operation ends by switching logical levels of an equalize control signal while activating a selected block after the comparison operation ends. Hence, according to the present invention, a control circuit controlling so as to suppress power consumption in a refresh operation can be constituted of a logic circuit.

A semiconductor memory device according to the present invention is a semiconductor memory device including a plurality of regions and each of the plurality of regions includes: a plurality of memory cell regions each including a first block including substitution rows on which first memory cells are arranged in a row direction and regular rows on which second memory cells are arranged in the row direction, and a plurality of second blocks each including regular rows without any substitution row; a plurality of row redundancy circuits provided correspondingly to the respective plurality of memory cell regions and each comparing a row address of a defective memory cell with an inputted row address to output a substitution row activating signal activating/deactivating a substitution row and a substitution row select signal indicating the presence or absence of selection of a substitution row on the basis of a result of the comparison; a block decoder receiving the substitution row select signal to generate a block select signal from the substitution row select signal for selectively activating/deactivating a first block and a plurality of second blocks included in a memory cell region corresponding to a redundancy circuit outputting the substitution row select signal received and output the block select signal to a first block and a plurality of second block included in the corresponding memory cell region; a plurality of substitution row decoders provided correspondingly to a plurality of first blocks included in a plurality of memory cell regions to each activate/deactivate a substitution row on the basis of a block select signal and a substitution row activating signal; a plurality of row decoder provided correspondingly to a plurality of second blocks included in a plurality of memory cell regions to each activate/deactivate a regular row on the basis of a block select signal and a row address signal; a column redundancy circuit comparing a column address of a defective memory cell with an inputted column address to generate a substitution column activating signal for activating/deactivating a substitution column to which a memory cell substituted for the defective memory cell is connected on the basis of a result of the comparison; a substitution column decoder activating/deactivating a substitution column on the basis of the substitution column activating signal; and a column decoder activating/deactivating a regular column on the basis of a column address, wherein the first memory cells each are a memory cell substituted for a defective memory cell among a plurality of second memory cells included in a first block and a plurality of second blocks, the column redundancy circuit includes: a storage circuit storing a column address of a defective memory cell included in a first block and a plurality of second blocks in each of a plurality of memory cell regions and selectively outputting a stored column address according to a region address specifying one of the plurality of memory cell regions; and a comparison circuit comparing a column address outputted from the storage circuit with an inputted column address to output a substitution column activating signal; in a period of a burn-in test, the block decoder receives a degenerated region address to output a block select signal for simultaneously activating a plurality of blocks specified by the same block address included in a plurality of memory cell regions; and the storage circuit selectively outputs a column address stored therein corresponding to a memory cell region specified by a region address.

In a semiconductor memory device according to the present invention, in a period of a burn-in test, word lines of the same address included in a plurality of memory cell regions are simultaneously activated while bit lines included in each of the plurality of memory cell regions are activated independently of the others. Therefore, according to the present invention, a burn-in test can be performed simultaneously over a plurality of memory cell regions. As a result, the burn-in test can be performed in a short time.

It is preferable that the storage circuit of the redundancy circuit further outputs a correspondence signal showing whether or not an outputted column address is a column address corresponding to a memory cell region specified by a region address and the comparison circuit thereof outputs a substitution column activating signal when receiving a correspondence signal showing that a column address outputted from the storage circuit is a column address corresponding to a memory cell region specified by a region address.

When an inputted column address coincides with a column address of a defective memory cell and a correspondence signal showing the column address of a defective memory cell is effective is inputted, the comparison circuit outputs a substitution column activating signal. Therefore, according to the present invention, it is prevented that a spare memory cell is activated instead of a normal memory cell.

It is preferable that the semiconductor memory device further includes: a row address buffer latching an address signal to output a row address of n (n is a natural number) bits; and a degeneration circuit outputting a degenerated signal of k bits (k is a natural number satisfying $1 \leq k < n$) by degenerating a row address of k bits included in the row address of n bits, wherein the block decoder receives the degenerated signal and a block address of m (m is a natural number satisfying $1 \leq m < n-k$) bits, a row decoder receives a row address of n−k−m bits from a row address buffer and the storage circuit receives a row address of k bits from the row address buffer.

In a period of a burn-in test, the block decoder receives a degenerated row address of k bits and a non-degenerated row address of m bits to simultaneously activate a plurality of blocks specified by the row address of m bits included in a plurality of memory cell regions and a row decoder activates a word line included in a block activated by the non-degenerated n−m−k bits. Therefore, by degenerating k bits of a row address of n bits, a plurality of blocks of the same address included in a plurality of memory cell regions can be simultaneously activated.

It is preferable that the comparison circuit outputs a deactivated substitution column activating signal when receiving an activated first test mode signal and further outputs a substitution column activating signal activating a substitution column specified by a column address of the substitution column when receiving an activated second test mode signal.

In a burn-in test, the first test mode signal is activated to perform a test on a memory cell connected to a regular column and thereafter, the second test mode signal is activated to perform a test on a memory cell connected to a substitution column. Therefore, according to the present invention, all the memory cells can be tested in a burn-in test.

It is preferable that the comparison circuit includes: a coincidence detecting circuit detecting whether or not a column address outputted from a storage circuit coincides with an inputted column address to output a coincidence/non-coincidence signal on the basis of a result of the detection; a first test mode circuit outputting a deactivating signal for deactivating a substitution column activating signal when receiving a activated first test mode, and outputting a coincidence/non-coincidence signal from said coincidence detecting circuit when receiving a deactivated first test mode; and a second test mode circuit outputting an activated substitution column activating signal on the basis of a column address when receiving an activated second test mode signal, and outputting a substitution column activating signal on the basis of a deactivating signal from the first test mode circuit or a coincidence/non-coincidence signal when receiving a deactivated second test mode signal.

A substitution column activating signal is activated/deactivated according to a coincidence/non-coincidence signal when deactivated first and second test mode signals are inputted. The substitution column activating signal is deactivated when activated first test mode signal and a deactivated second test mode signal are inputted. A substitution column is activated according to an inputted column address when activated first and second test mode signals are inputted. Therefore, according to the present invention, various kinds of tests can also be performed using two test mode signals.

It is preferable that the coincidence detecting circuit is constituted of a first operational circuit performing an exclusive OR operation on a column address outputted from a storage circuit and an inputted column address, the first test mode circuit is constituted of a second operational circuit performing an AND operation on an output signal from the first operational circuit and an inverted signal of a first test mode, and the second test mode circuit is constituted of a third operational circuit performing an AND operation on a column address and a second test mode signal and a fourth operational circuit performing an OR operation on an output signal from the second operational circuit and an output signal from the third operational circuit. Therefore, according to the present invention, various kinds of test modes can be realized by the logic circuits.

It is preferable that a column redundancy circuit is constituted of a plurality of redundancy circuits provided correspondingly to respective plurality of substitution columns and a prescribed number of redundancy circuit among the plurality of redundancy circuits each include a storage circuit in which a column address of a defective memory cell is at least electrically written to store the written column address therein.

A column address of a defective memory cell is electrically written in some redundancy circuits among the plurality of redundancy circuits. Therefore, according to the present invention, a column address of a defective memory cell can be written even when the defective memory cell is detected in a test after a semiconductor memory device is packaged. As a result, a fraction defective can be reduced.

It is preferable that each of the plurality of row redundancy circuits include a plurality of redundancy circuits provided correspondingly to a plurality of substitution rows and each of a prescribed number of redundancy circuits among the plurality of redundancy circuits includes a storage circuit in which a row address of a defective memory cell is at least electrically written to store the written row address therein.

A row address of a defective memory cell is electrically written in some redundancy circuits among the plurality of redundancy circuits. Therefore, according to the present invention, a defective memory cell can be functionally saved even when the defective memory cell is detected in a test after a semiconductor memory device is packaged. As a result, a fraction defective can be reduced.

It is preferable that a storage circuit includes: a first fuse circuit constituted of a first fuse to be blown by supplying a current; and a second fuse circuit constituted of a second fuse blown by irradiation with laser light, wherein a column address is written in the first fuse circuit by blowing the first fuse and the second fuse becomes conductive in the second fuse circuit to output the same logical signal as that of a column address outputted from the first fuse circuit.

By supplying a current in the first fuse circuit, the fuse is blown to write a column address of a defective memory cell. Therefore, according to the present invention, a column address of a defective memory cell can be easily written by supplying a current.

It is preferable that a first fuse is constructed of a first conductor which is blown and a second conductor disposed so as to sandwich the first conductor at least vertically or horizontally.

When a current flows through the first and second conductors, a temperature of the first conductor rises higher than that of the second conductor. Therefore, according to the present invention, the first conductor can be easily blown even with a small current.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 5 is a circuit diagram of a comparison circuit included in a row redundancy circuit shown in FIG. 4;

FIG. 6 is a circuit diagram of program circuits included in the comparison circuit of FIG. 5;

FIG. 7 is a table showing block addresses specifying 16 blocks shown in FIG. 4;

DESCRIPTION OF THE PREFERRED EMBODIMENTS

Figure 1:
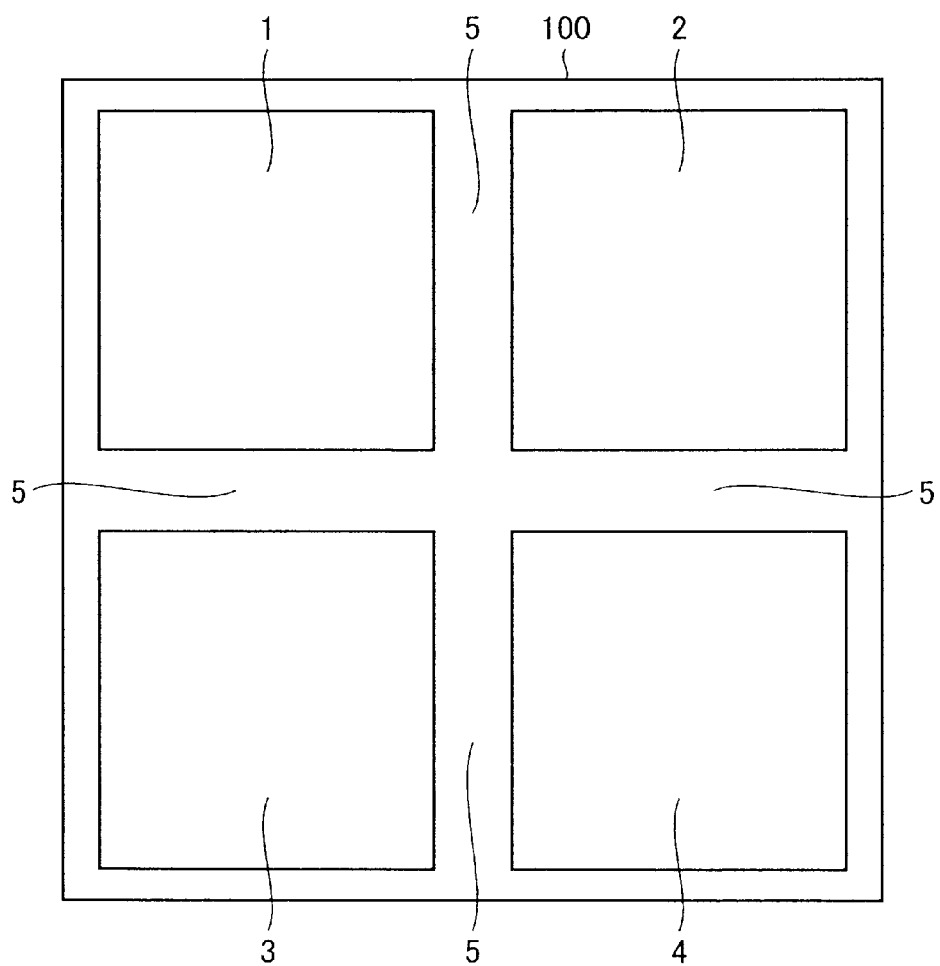
FIG. 1 is a schematic block diagram showing a configuration of a semiconductor memory device according to a first embodiment of the present invention.

Detailed description will be given of embodiments of the present invention below with reference to the accompanying drawings. Note that the same symbols are attached to the same or corresponding constituents in the drawings and no description thereof is repeated.

First Embodiment

Referring to FIG. 1, a semiconductor memory device 100 according to the first embodiment includes: banks 1 to 4; and a peripheral section 5. As a concrete example, a 256 Mbit SDRAM (Synchronous Dynamic Random Access Memory) is thought of and each of the banks 1 to 4 has a storage capacity of 64 Mbits. Furthermore, each of the banks 1 to 4 has 8192 row addresses (a row address of 13 bits including RA0 to RA12). The peripheral section 5 includes: a row decoder, a column decoder, block decoder, a redundancy circuit and so on.

In the semiconductor memory device 100 constructed of 4 banks, 4 memory cell arrays are included and a control signal buffer, an address buffer, a row related peripheral circuit, a column decoder and so on are shared by adjacent memory cell arrays 50. Therefore, description will be given of one bank and circuits arranged in the peripheral area thereof below for convenience of description.

Figure 2:
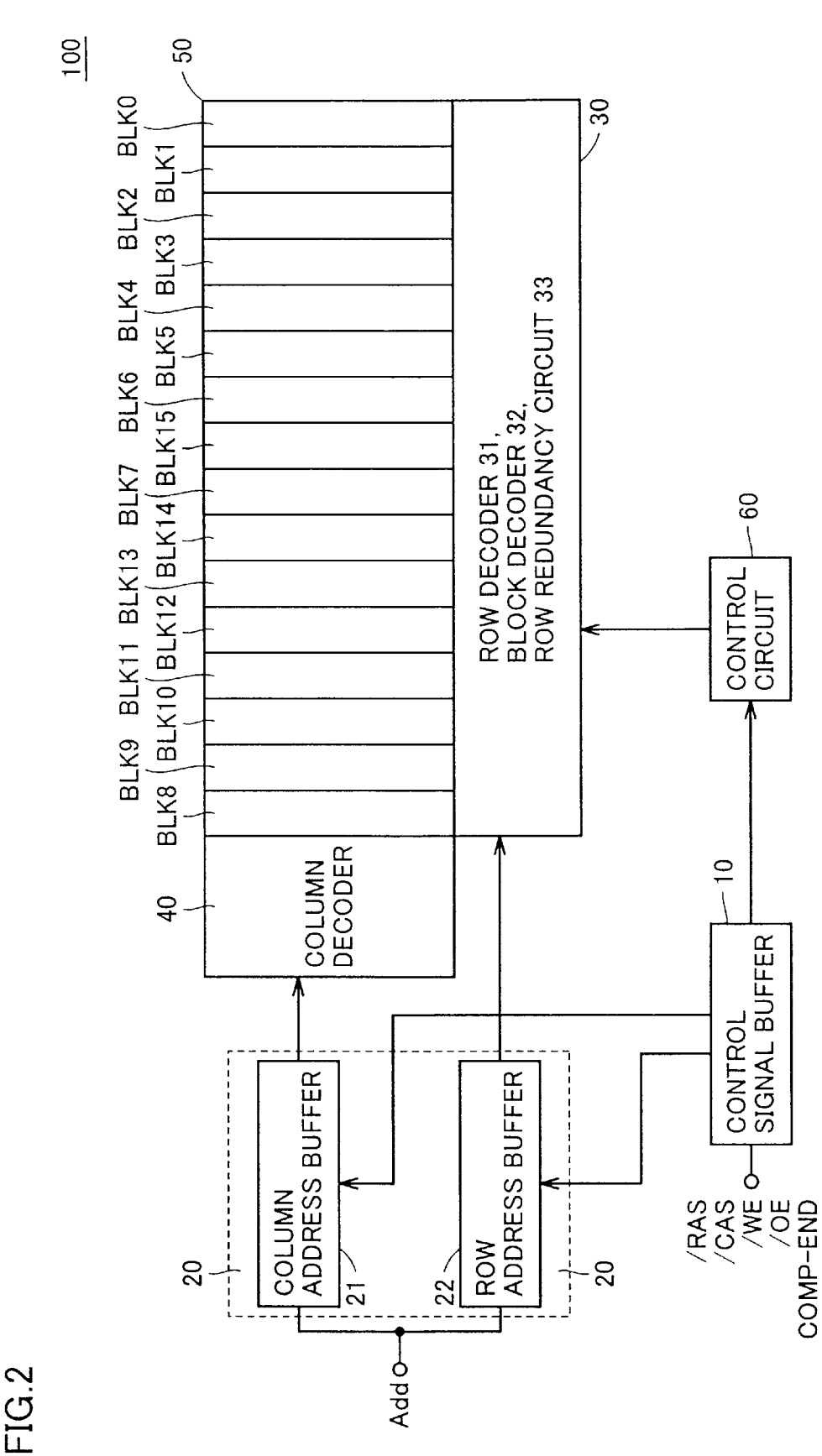
FIG. 2 is a block diagram representing a more detailed configuration of the semiconductor memory device shown in FIG. 1.

Referring to FIG. 2, the semiconductor memory device 100, in more detail, includes: a control signal buffer 10; an address buffer 20; a row related peripheral circuit 30; a column decoder 40; a memory cell array 50; and a control circuit 60. The address buffer 20 is constructed of: a column address buffer 21; and a row address buffer 22. The row related peripheral circuit 30 includes: a row decoder 31; a block decoder 32; and a row redundancy circuit 33.

The control signal buffer 10 latches a row address strobe signal /RAS, a column address strobe signal /CAS, a write enable signal /WE, an output enable signal /OE and a comparison period end signal COMP_END to output the row address strobe signal /RAS to the row address buffer 22, the column address strobe signal /CAS to the column address buffer 21, the write enable signal /WE, the output enable signal /OE and the comparison period end signal COMP_END to the control circuit 60. Note that the comparison period end signal COMP_END is a signal defining a period of comparison of an inputted row address with a row address of a defective memory cell.

The column address buffer 21 latches an address signal Add in synchronism with a timing at which the column address strobe signal /CAS from the control signal buffer 10 goes to L (logical low) level to output the latched address signal Add to the column decoder 40 as a column address. The row address buffer 22 latches an address signal Add in synchronism with a timing at which the row address strobe signal /RAS from the control signal buffer 10 goes to L level to output the latched address signal Add to the row decoder 31, the block decoder 32 and the row redundancy circuit 33 as a row address.

The row decoder 31 decodes a row address from the row address buffer 22 to activate a word line specified by the decoded row address. The block decoder 32 selectively activates blocks BLK0 to BLK15 constituting the memory cell array 50 according to a method described later. The redundancy circuit 33 compares an inputted row address with a programmed row address of a defective memory cell according to a method described later and as a result of the comparison, output a substitution row activating signal SRS for activating a word line to which a substitution memory cell substituted for a defective memory cell is connected and a substitution row select signal SRE showing that a word line to which a substitution memory cell is connected has been selected.

The column decoder 40 decodes a column address from the column address buffer 21 to activate a bit line specified by the decoded column address. The memory cell array 50 is constructed of the blocks BLK0 to BLK15. Each of the blocks BLK0 to BLK15 includes a plurality of memory cells arranged in the form of a matrix. The control circuit 60 outputs an equalize control signal for equalizing a bit line pair to a precharge voltage and a word line control signal for activating a word line to the row related peripheral circuit 30 in response to the write enable signal /WE and the output enable signal /OE from the control signal buffer circuit 10. The control circuit 60 controls all of the operation performed in the semiconductor memory device 100.

Figure 3:
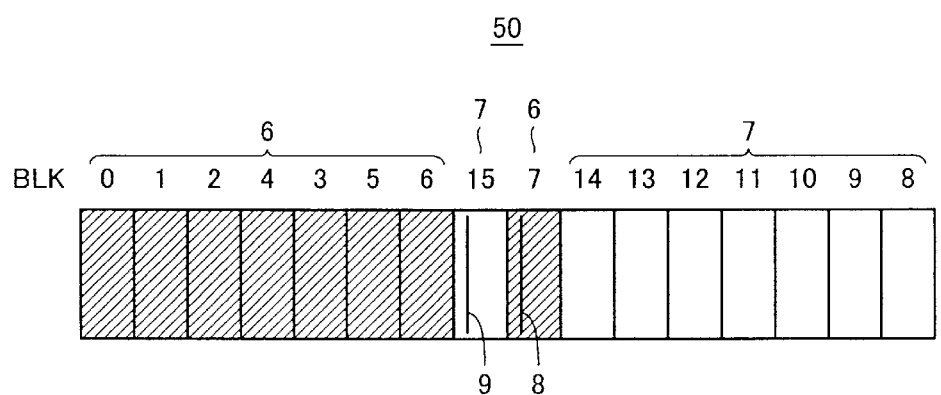
FIG. 3 is a drawing representing arrangement of blocks constituting a memory cell array shown in FIG. 2.

Referring to FIG. 3, the memory cell array 50 included in each of the banks 1 to 4 is constructed of the 16 blocks BLK0 to BLK15. Shared sense amplifiers (not shown) are each provided between two adjacent blocks. Furthermore, the blocks BLK0 to BLK15 is divided into two memory cell regions 6 and 7. The memory cell region 6 is constituted of the blocks BLK0 to BLK7 and the memory cell region 7 is constituted of the blocks BLK8 to BLK15.

In the memory cell region 6, the blocks BLK0 to BLK6 include regular rows (not shown) only and the block 7 includes regular rows (not shown) and a spare row 8. When a memory cell connected to a regular row of one of the blocks BLK0 to BLK7 is defective, a spare memory cell substituted for the defective memory cell is connected to the spare row 8. The blocks BLK0 to BLK6 are continuously arranged and the block 7 is arranged such that the block BLK15 belonging to the memory cell region 7 exists between the blocks BLK6 and BLK7.

In the memory cell region 7, the blocks BLK8 to BLK14 include regular rows (not shown) only and the block 15 includes regular rows (not shown) and a spare row 9. When a memory cell connected to a regular row of one of the blocks BLK8 to BLK15 is defective, a spare memory cell substituted for the defective memory cell is connected to the spare row 9. The blocks BLK8 to BLK14 are continuously arranged and the block 15 is arranged such that the block BLK7 belonging to the memory cell region 6 exists between the blocks BLK14 and BLK15.

Figure 4:
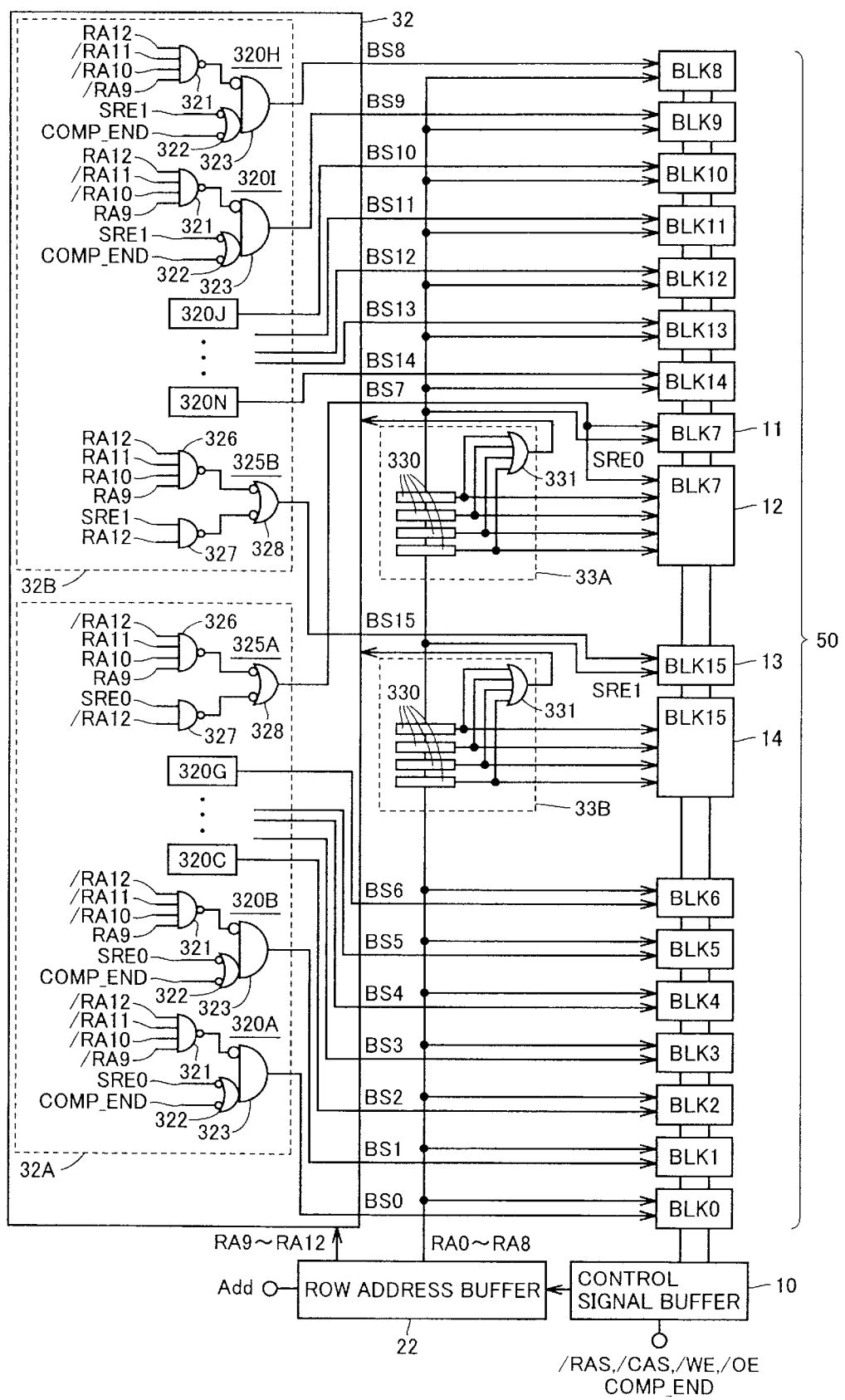
FIG. 4 is a diagram representing arrangement of a block decoder, a row redundancy circuit, a row address buffer, a control signal buffer and a plurality of blocks; and a circuit diagram of a block decoder in the semiconductor memory device shown in FIG. 2.

FIG. 4 shows a row related circuit. The row address buffer 22 outputs the higher 4 bits RA9 to RA12 of a row address of 13 bits to the block decoder 32 and the lower 9 bits RA0 to RA8 to row redundancy circuits 33A and 33B, and the blocks BLK0 to BLK15.

The row redundancy circuits 33A and 33B are each constructed of comparison circuits 330 and an OR gate 331. Since FIG. 4 shows a case where 4 substitution rows are provided, the row redundancy circuit 33A and 33B each include 4 comparison circuits 330. The OR gate 331 receives 4 output signals from the 4 comparison circuits 330 to calculate an OR of the received 4 output signals and output a substitution row select signal SRE 0 or SRE 1.

Referring to FIG. 5, a comparison circuit 330 includes: program circuits 340 to 34n; N channel MOS transistors 3310 to 331n, 3320 to 332n, 3330 to 333n, and 3340 to 334n; a P channel MOS transistor 351; and inverters 350 and 352 to 354. The N channel MOS transistors 3310 and 3330, the N channel MOS transistors 3320, 3340, . . . , the N channel MOS transistors 331n and 333n, and the N channel MOS transistors 332n and 334n are all connected in series between a node 356 and ground nodes 332. The program circuit 340 outputs two output signals FRA and /FRA to the gate terminals of the respective N channel MOS transistors 3310 and 3320. The program circuit 34n outputs two output signals FRA and /FRA to the gate terminals of the respective N channel MOS transistors 331n and 332n. The N channel MOS transistors 3330 to 333n receive row address RA0 to RAn at the respective gate terminals thereof and the N channel MOS transistors 3340 to 334n receive row address /RA0 to /RAn at the respective gate terminals thereof In the first embodiment, since the row address of 9 bits RA0 to RA8 is inputted to the comparison circuit 330, n=8. The P channel transistor 351 is connected between a power source node 355 and the node 356, and the inverters 352 and 353 constitutes a latch circuit.

Referring to FIG. 6, each of the program circuits 340 to 34n includes: a P channel MOS transistor 360; an N channel MOS transistor 361; a fuse 362; inverters 363 and 364. The P channel MOS transistor 360 and the fuse 362 are connected in series between a power source node 365 and a node 368. In this case, the P channel MOS transistor 360 is connected to the power source 365 side and the fuse 362 is connected to a node 368 side. The N channel MOS transistor 361 is connected between the node 368 and a ground node 366. The P channel MOS transistor 360 and the N channel MOS transistor 361 receive a precharge signal SRP at the gate terminals thereof. The inverters 363 and 364 constitute a latch circuit. The fuse 362 is a fuse which can be blown by laser light and when the blowing is performed, data [1] is written while when no blowing is performed, data [0] is written.

In the standby, the precharge signal SRP is at H (logical high) level to turn off the P channel MOS transistor 360, while turning on the N channel MOS transistor 361. Thereby, the program circuits 340 to 34n are each reset. When an access gets started, the precharge signal SRP goes to L level and when the fuse 362 is not blown, the signal FRA of H level and the signal /FRA of L level are outputted. On the other hand, when the fuse 362 is blown, the signal FRA of L level and the signal /FRA of H level are outputted. Therefore, the program circuits 340 to 34n each output the signals FRA and /FRA corresponding to a row address of a defective memory cell written by blowing of the fuse 362.

Referring again to FIG. 5, since in the standby, the row address RA0 to RAn is at L level, the program circuit 340 to 34n are reset and the precharge signal SRP is at H level, the comparison circuit 330 outputs the substitution row activating signal SRS of H level. Therefore, the OR gate 331 outputs the substitution row select signal SRE0 or SRE1 of H level.

When access gets started, the precharge signal SRP goes to L level and the program circuits 340 to 34n output a programmed row address of a defective memory cell to the N channel MOS transistors 3310 to 331n, and 3320 to 332n. The N channel MOS transistors 3310 to 331n and 3340 to 334n receive the row address RA0 to RA8 at the gate terminals thereof. When the programmed row address from the program circuits 340 to 34n coincides with an inputted row address, the node 356 stays at H level, while when the programmed row address does not coincide with the inputted row address, the node 356 goes to L level.

That is, when the fuse 362 is blown, the data [1] is written and the program circuits 340 to 34n each output the signal FRA of L level and the signal /FRA of H level. On the other hand, when the fuse 362 is not blown, data [0] is written and the program circuits 340 to 34n each output the signal FRA of H level and the signal /FRA of L level. Therefore, when the programmed row address coincides with the inputted row address, one of the N channel MOS transistors 3310 and 3330, one of the N channel MOS transistors 3320 and 3340, ..., one of the N channel MOS transistors 331n and 333n and one of the N channel MOS transistors 332n and 334n are turned off and the node 356 stays at H level. As a result, the inverter 354 outputs the substitution row activating signal SRS of the same H level as that of the node 356.

When the programmed row address does not coincide with the inputted row address RA0 to RAn, the N channel MOS transistors 3310 and 3330, ..., and the N channel MOS transistors 331n and 333n are all turned on, or the N channel MOS transistors 3320 and 3340, ..., and the N channel MOS transistors 332n and 334n are all turned on; therefore, the node 356 goes to L level and the inverter 354 outputs the substitution row activating signal SRS of the same L level as that of the node 356.

In such a situation, the OR gate 331 outputs the substitution row select signals SRE0 or SRE1 of H level showing that a substitution row has been selected when at least one substitution row activating signal SRS among the 4 substitution row activating signals SRS from the 4 comparison circuits 330 is at H level, As a result, the row redundancy circuit 33A outputs the substitution row select signal SRE0 to a block select circuit 32A of the block decoder 32 and outputs the substitution activating signal SRS0 to a region 12 of the block BLK7 in which a substitution row is disposed. Furthermore, the row redundancy circuit 33B outputs the substitution row select signal SRE1 to the block select circuit 32B of the block decoder 32 and outputs the substitution row activating signal SRS1 to a region 14 of the block BLK15 in which a substitution row is disposed.

Referring again to FIG. 4, the block decoder 32 is constructed of the block select circuit 32A and 32B. The block select circuit 32A is provided correspondingly to the memory cell region 6 and selectively activates the blocks BLK0 to BLK7 disposed in the memory cell region 6. The block select circuit 32B is provided correspondingly to the memory cell region 7 and selectively activates the blocks BLK8 to BLK15 disposed in the memory cell region 7.

The block select circuit 32A is constructed of block select signal generating circuits 320A, 320B, 320C, 320D, 320E, 320F, 320G and 325A. The block select circuit 32B is constructed of block select signal generating circuits 320H, 320I, 320J, 320K, 320L, 320M, 320N and 325B. The block select signal generating circuits 320A to 320N are each constructed of: a NAND gate 321; a NOR gate 322 and an AND gate 323. The block select signal generating circuits 325A and 325B are each constructed of: NAND gates 326 and 327 and a NOR gate 328.

The row address RA9 to RA12 from the row address buffer 22 is inputted to the NAND gates 321 of the block select signal generating circuits 320A to 320N and the NAND gates 326 of the block select signal generating circuits 325A and 325B. To be more detailed, the row address /RA9, /RA10, /RA11 and /RA12 is inputted to the NAND gate 321 of the block select signal generating circuit 320A, the row address RA9, /RA 10, /RA11 and /RA12 is inputted to the NAND gate 321 of the block select signal generating circuit 320B, the row address /RA9, RA 10, /RA11 and /RA12 is inputted to the NAND gate 321 of the block select signal generating circuit 320C, the row address RA9, RA 10, /RA11 and /RA12 is inputted to the NAND gate 321 of the block select signal generating circuit 320D, the row address /RA9, /RA 10, RA11 and /RA12 is inputted to the NAND gate 321 of the block select signal generating circuit 320E, the row address RA9, /RA 10, RA11 and /RA12 is inputted to the NAND gate 321 of the block select signal generating circuit 320F, the row address /RA9, RA10, RA11 and /RA12 is inputted to the NAND gate 321 of the block select signal generating circuit 320G and the row address RA9, RA 10, RA11 and /RA12 is inputted to the NAND gate 326 of the block select signal generating circuit 325A.

The row address /RA9, /RA 10, /RA11 and RA12 is inputted to the NAND gate 321 of the block select signal generating circuit 320H, the row address RA9, /RA 10, /RA11 and RA12 is inputted to the NAND gate 321 of the block select signal generating circuit 320I, the row address /RA9, RA 10, /RA11 and RA12 is inputted to the NAND gate 321 of the block select signal generating circuit 320J, the row address RA9, RA 10, /RA11 and RA12 is inputted to the NAND gate 321 of the block select signal generating circuit 320K, the row address /RA9, /RA 10, RA11 and RA12 is inputted to the NAND gate 321 of the block select signal generating circuit 320L, the row address RA9, /RA 10, RA11 and RA12 is inputted to the NAND gate 321 of the block select signal generating circuit 320M, the row address /RA9, RA 10, RA11 and RA12 is inputted the NAND gate 321 of the block select signal generating circuit 320N, the row address RA9, RA 10, RA11 and RA12 is inputted to the NAND gate 326 of the block select signal generating circuit 325B.

Since each of the row address RA9 to RA12 can assume [1] or [0], the row address RA9 to RA12 has 16 combinations as shown in FIG. 7. Among the combinations, the group Gr1 has 8 combinations of address bits in which each of RA9 to RA11 can assume [1] or [0] with RA12 at a fixed value [0] and Gr2 has 8 combinations of address bits in which each of RA9 to RA11 can assume [1] or [0] with RA12 at a fixed value [1]. The block select circuit 32A receives the row address RA9 to RA12 belonging to the group Gr1 and the block select circuit 32B receives the row address RA9 to RA12 belonging to the group Gr2. That is, the block select circuit 32A receives the row address RA9 to RA12 in which RA 12 is of a value [0] and the block select circuit 32B receives the row address RA9 to RA12 in which RA 12 is of a value [1].

Since the address RA9 to RA11 can assume 8 values, one of 8 variations in combination of the row address RA9 to RA12, as described above, is inputted to each of the block select signal generating circuits 320A to 320G and 325A included in the block select circuit 32A. Furthermore, one of 8 variations in combination of the row address RA9 to RA12 is also inputted to each of the block select signal generating circuit 320H to 320N and 325B included in the block select circuit 32B. The block select circuit 32A is provided correspondingly to the memory cell region 6 and the block select circuit 32B is provided correspondingly to the memory cell region 7; therefore, the row address RA12 is a region address specifying the memory cell region 6 or 7. The row address RA9 to RA11 is a block address specifying each of the blocks BLK0 to BLK7 disposed in the memory cell region 6 and each of the blocks BLK8 to BLK15 disposed in the memory cell region 7.

The NOR gates 322 of the block select signal generating circuits 320A to 320N each receive the substitute select signal SRE0 or SRE1 and a comparison period end signal COMP_END, as described above. The comparison period end signal COMP_END stays at L level till a comparison operation ends in which a programmed row address is compared with an inputted row address in the redundancy circuit 330 while going to H level after the comparison operation ends. Therefore, the block select signal generating circuit 320A to 320G output the block select signals BS0 to BS6 of H levels for selecting the respective corresponding blocks BLK0 to BLK6 when the row address RA9 to RA12 specifying each of the corresponding blocks BLK0 to BLK6 is inputted in a period in which the comparison period end signal COMP_END of L level is inputted, that is till the comparison operation ends.

When the comparison operation ends, the block select signal generating circuit 320A to 320G receive the comparison period end signal COMP_END of H level and the row address RA9 to RA12 specifying the corresponding blocks BLK0 to BLK6 is inputted thereto. Furthermore, when the block select signal generating circuit 320A to 320G receive the substitution row select signal SRE0 of L level from the row redundancy circuit 33A, the circuits output the block select signal BS0 to BS6 for selecting the corresponding blocks BLK0 to BLK6. That is, in this case, since no defective memory cell exists in the corresponding blocks BLK0 to BLK6 and no substitution row disposed in the region 12 of the block BLK7 is selected, one of the blocks BLK0 to BLK6 specified by the block address RA9 to RA11 is selected.

Moreover, when the block select signal generating circuit 320A to 320G receive the comparison period end signal COMP_END of H level and the substitution row select signal SRE0 of H level, the circuits output the block select signals BS0 to BS6 of L level not selecting the corresponding blocks BLK0 to BLK6 even if the row address RA9 to RA12 specifying the corresponding one of the blocks BLK0 to BLK6 is inputted. That is, in this case, since a defective memory cell exists in the corresponding one of the blocks BLK0 to BLK6 and a substitution row disposed in the region 12 of the block BLK7 is selected, any of the blocks BLK0 to BLK6 specified by the block address RA9 to RA11 is not selected.

The block select signal generating circuits 320H to 320N exert the same function as that of the block select signal generating circuit 320A to 320G. In this case, the block select signal generating circuits 320H to 320N receive the substitution row select signal SRE1 from the row redundancy circuit 33B.

On the other hand, an AND gate 327 of the block select signal generating circuit 325A receives the region address /RA12 and the substitution select signal SRE0. An AND gate 327 of the block select signal generating circuit 325B receives the region address RA12 and the substitution row select signal SRE1.Therefore, the block select signal generating circuit 325A outputs the block select signal BS7 of H level when the block address RA9 to RA11 for specifying the corresponding block BLK7 is inputted thereto, or alternatively when the substitution row select signal SRE0 of H level is inputted. That is, the block select signal generating circuit 325A outputs the block select signal BS7 of H level when the block BLK7 is specified by the block address RA9 to RA11, or alternatively when a defective memory cell is included in one of the blocks BLK0 to BLK6 and a memory cell included in the region 12 of the block BLK7 substituted for the defective memory cell is activated.

Moreover, the block select signal generating circuit 325A outputs the block select signal BS7 of L level when the substitution row select signal SRE0 of L level is inputted thereto while the block address RA9 to RA11 specifying the corresponding block BLK7 is not inputted thereto. In this case, the block select signal generating circuit 325A outputs the block select signal BS7 of H level or L level to a region 11 including regular rows only of the block BLK7 and to the region 12 including substitution rows only thereof.

The block select signal generating circuit 325B has the same function as does the block select signal generating circuit 325A. In this case, the block select signal generating circuit 325B outputs the block select signal BS15 of H level or L level to a region 13 including regular rows only of the block BLK15 and a region 14 including substitution rows only thereof.

Figure 8:
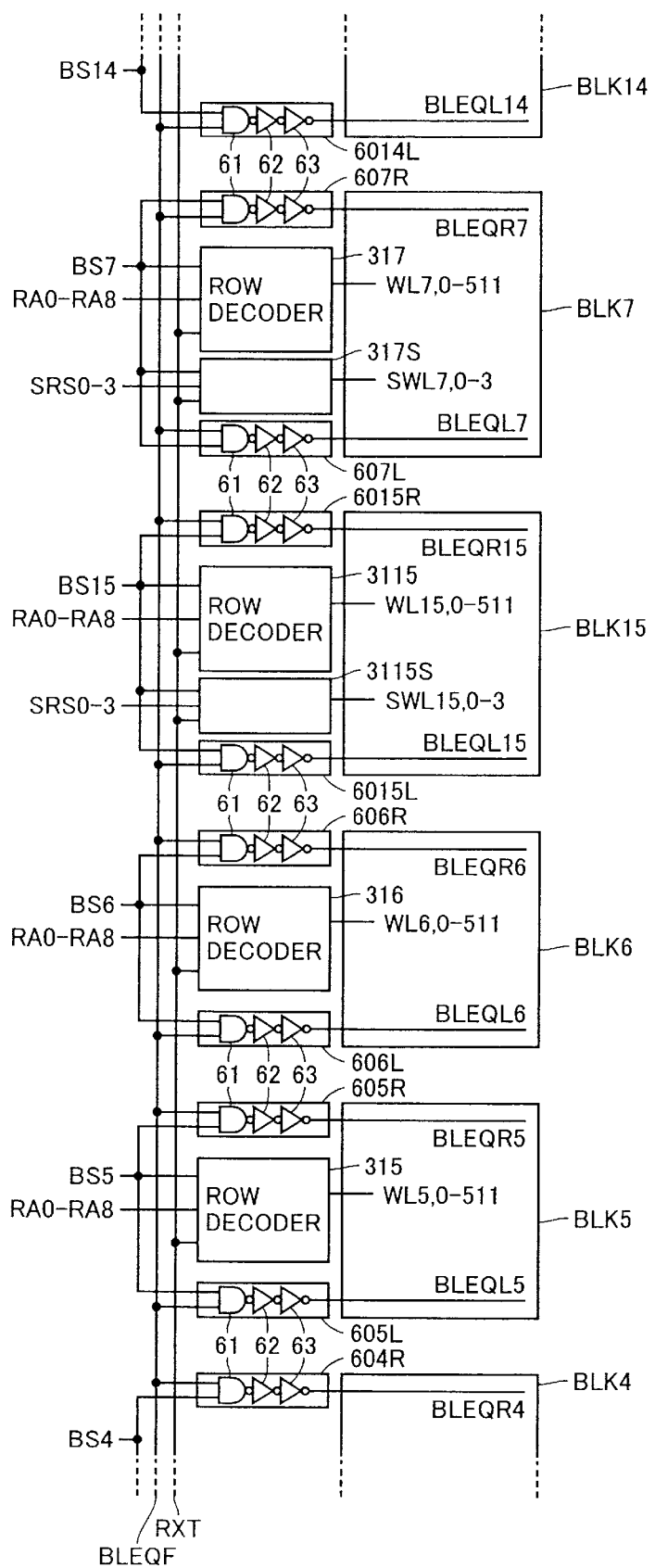
FIG. 8 is a schematic block diagram showing some blocks among a plurality of blocks shown in FIG. 4, and row decoders and bit line equalize circuits corresponding to the respective blocks.

Referring to FIG. 8, description will be given of a method activating each of the blocks BLK0 to BLK15. In FIG. 8, there are shown the blocks BLK4 to BLK7 included in the memory cell region 6 and the blocks BLK14 and BLK15 included in the memory cell region 7. Since the semiconductor memory device 100 adopts shared sense amplifiers, the sense amplifiers each exist between adjacent two blocks. Therefore, one block includes two bit line equalize circuits (not shown). In FIG. 8, bit line equalize signals activating/deactivating two bit line equalize circuits are shown as BLEQRs and BLEQLs (s indicates a block number).

A row decoder 317, a spare row decoder 317S and bit line equalize circuits 607R and 607L are provided correspondingly to the block BLK7; a row decoder 3115, a spare row decoder 3115S and bit line equalize circuits 6015R and 6015L are provided correspondingly to the block BLK15; a row decoder 316 and bit line equalize circuits 606R and 606L are provided corresponding to the block BLK6; and a row decoder 315 and bit line equalize circuits 605R and 605L are provided correspondingly to the block BLK5. Note that in FIG. 8, there is shown one of bit line equalize circuits of a pair provided correspondingly to each of the blocks BLK4 and BLK14: that is respective bit line equalize circuits 604R and 6014L.

A NAND gate 61 and inverters 62 and 63 constitute each of bit line equalize circuits 604R, 605R, 605L, 606R, 606L, 607R, 607L, 6015R, 6015L, 6014R and, 6014L. The NAND gate 61 receives the equalize control signal BLEQF, the block select signal BS4 to BA7, BS14 and BS15. Therefore, when receiving the block select signals BS4 to BS7, BS14 and BS15 of L level, then the bit line equalize circuits 604R, 605R, 605L, 606R, 606L, 607R, 607L, 6015R, 6015L, 6014R and, 6014L output bit line equalize signals BLEQR4, BLEQR5, BLEQL5, BLEQR6, BLEQR7, BLEQL7, BLEQR14, BLEQR15 and BLEQL15 of H level, respectively. That is, if any of the blocks BLK4 to BLK7, BLK14 and BLK15 are not selected but stay in the standby state, a bit line pair is equalized.

When receiving the respective block select signals BS4 to BS7, BS14 and BS15 of H level and the equalize control signal BLEQF of L level, then the bit line equalize circuits 604R, 605R, 605L, 606R, 606L, 607R, 607L, 6015R, 6015L, 6014R and, 6014L output the bit line equalize signals BLEQR4, BLEQR5, BLEQL5, BLEQR6, BLEQR7, BLEQL7, BLEQR14, BLEQR15 and BLEQL15 of H level, respectively.

Furthermore, when receiving the block select signals BS4 to BS7, BS14 and BS15 of H level and the equalize control signal BLEQF of H level, then the bit line equalize circuits 604R, 605R, 605L, 606R, 606L, 607R, 607L, 6015R, 6015L, 6014R and, 6014L output the bit line equalize signals BLEQR4, BLEQR5, BLEQL5, BLEQR6, BLEQR7, BLEQL7, BLEQR14, BLEQR15 and BLEQL15 of L level, respectively. That is, a word line is activated to be in a state of readiness to input/output data to/from a memory cell.

The row decoders 315 to 317 and 3115 receive the corresponding block select signals BS5 to BS7 and BS15, a word line control signal RXT and the row address RA0 to RA8. When the corresponding block select signals BS5 to BS7, and BS15 are at H level, the row decoders 315 to 317 and 3115 are activated to decode the row address RA0 to RA8. The row decoders 315 to 317 and 3115 each activate a word line specified by the decoded row address RA0 to RA8 according to a timing defined by the word line control signal RXT. For example, the row decoder 317 activates a word line specified by the row address RA0 to RA8 among 512 word lines WL 7, 0 to 511. Furthermore, the row address 315 to 317 and 3115 are deactivated when the corresponding block select signals BS5 to BS7 and BS15 are at L level.

The spare decoders 317S and 3115S receive the respective corresponding block select signal BS7 and BS15, the substitution activating signal SRS0 to SRS3 and the word line control signal RXT. When the corresponding block select signal BS7 and BS15 are at H level, the spare decoders 317S and 3115S are activated to activate a spare word line specified by the substitution row activating signal SRS0 to SRS3 according to a timing defined by the word line control signal RXT. For example, the spare row decoder 317S activates a word line specified by the substitution row activating signal SRS0 to SRS3 among 4 word lines SWL7, 0 to 3. Furthermore, the spare decoders 317S and 3115S are deactivated when the respective corresponding block select signals BS7 and BS15 are at L level.

Figure 9:
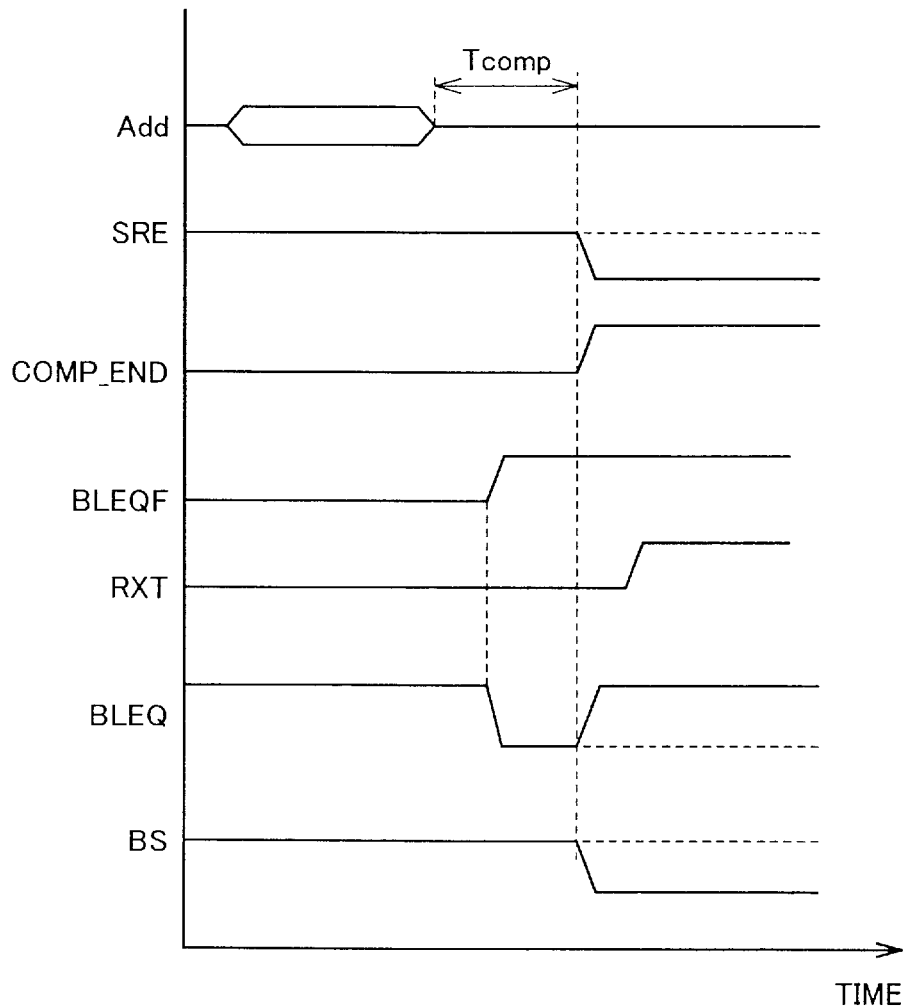
FIG. 9 is a timing chart of signals used in the schematic diagrams shown in FIGS. 4 and 9.

Referring to FIG. 9, when an address signal Add is inputted and the row address RA0 to RA8 is inputted to the redundancy circuits 33A and 33B, the row redundancy circuits 33A and 33B each compare a programmed row address with an inputted address RA0 to RA8. A comparison period Tcomp in which the row redundancy circuits 33A and 33B each compare the programmed row address with the inputted row address is defined a period till the comparison period end signal COMP_END is switched from L level to H level after inputting of the row address RA0 to RA8 ends. The substitution row select signal SRE stays at H level during the comparison operation, while staying at H level or being switched to L level according to a result of the comparison after the comparison period Tcomp ends. The substitution row select signal SRE stays at H level when the programmed row address coincides with the inputted row address, while switching to L level when no coincidence arises.

The equalize control signal BLEQF is outputted from the control circuit 60 and switched from L level to H level by the end of the comparison period Tcomp. When the equalize control signal BLEQF is at L level, a bit line equalize signal is activated and a bit line pair is equalized as described above. On the other hand, when the equalize control signal BLEQF is at H level, a bit line equalize signal is deactivated to enter a state of readiness to activate a word line. Therefore, in the semiconductor memory device 100, equalization of a bit line pair progresses in parallel to an operation of comparing the programmed row address with the inputted row address performed by the row redundancy circuits 33A and 33B to enter a state of readiness to activate a word line. After the comparison period Tcomp ends, the word line control signal RXT defining a timing at which a word line is activated is switched from L level to H level to activate a word line WL or a spare word line SWL.

In the configuration shown in FIG. 4, two blocks are selected till the comparison period Tcomp of the row redundancy circuits 33A and 33B ends, and in the period, equalization of a bit line pair finishes and a preparation to activate a word line progresses in the two blocks. For example, considered a case in which the row address RA9=RA10=RA12=0 and RA11=1 specifying the block BLK5 is inputted to the block select signal generating circuit 320E. Since the block select signal generating circuit 320E receives the substitution row select signal SRE0 of H level and the comparison period end signal COMP_END of L level till a comparison operation in the row redundancy circuit 33A ends, the block select signal generating circuit 320E outputs the block select signal BS5 of H level to the block BLK5. Then, the row decoder 315 is activated by the block select signal BS5 of H level. Moreover, the bit line equalize circuits 605R and 605L receive the block select signal BS5 of H level and the equalize control signal BLEQF of L level till a some point in the comparison period Tcomp and outputs the bit line equalize signals BLEQR5 and BLEQL5 to equalize a bit line pair. The bit line equalize circuits 605R and 605L output the bit line equalize signals BLEQR5 and BLEQL5 of L level when receiving the equalize control signal BLEQF whose level has been switched to H level at one point in the comparison period Tcomp. In this case, a bit line select signal BLI (not shown) is also switched to L level. Thereby, equalization of a bit line pair of the block BLK5 ends to enter a state of readiness to selectively activate the word lines WL5, 0 to 511.

On the other hand, since the block select signal generating circuit 325A receives the substitution row select signal SRE0 of H level and the row address RA12=0 during the comparison period Tcomp, the circuit outputs the block select signal BS7 of H level to the row decoder 317 and the spare row decoder 315S. Therefore, progress is effected of activation of the row decoder 315 and the spare row decoder 315S, and equalization of a bit line pair and preparation for activation of a word line in the block BLK7 as is similar to the case of the block BLK5.

When the substitution row select signal SRE0 stays at H level after the comparison period Tcomp ends, the block select signal generating circuit 320E outputs the block select signal BS5 of L level on the basis of the comparison period end signal COMP_END of H level and the substitution row select signal SRE0 of H level. Thereby, the bit line equalize circuits 605R and 605L output the bit line equalize signals BLEQR5 and BLEQL5 of H level to again equalize a bit line pair. Then, the block BLK5 enters a non-selected state. On the other hand, the block select signal generating circuit 325A outputs the block select signal BS7 of H level on the basis of the substitution row select signal SRE0 of H level and the row address R12=0 after the comparison period Tcomp ends as well. While the row decoder 317 decodes the row address RA0 to RA8, the word line WL7, 1 to 511 included in the block BLK7 are not specified by the decoded row address; therefore, any of the word lines WL7, 0 to 511 is kept as deactivated. Since the spare row decoder 317S receives the substitution row activating signals SRS0 to SRS3 of H level from the row redundancy circuit 33A, the decoder activates spare word lines SWL0 to SWL3 according to the substitution row activating signal SRS0 to SRS3. With the activation by the decoder, one of the spare word lines SWL0 to SWL3 disposed in the region 12 of the block BLK7 is activated instead of a defective memory cell included in the block BLK5 and data is inputted/outputted to/from a spare memory cell.

When the substitution row select signal SRE0 is switched to L level after the comparison period Tcomp ends, the block select signal generating circuit 320E outputs the block select signal BS5 of H level on the basis of the comparison period end signal COMP_END of H level, the substitution row select signal SRE0 of L level and the row address RA9=RA10=RA12=0 and RA11=1. Then, the row decoder 315 receives the block select signal BS5 of H level to be activated and decodes the row address RA0 to RA8. The bit line equalize circuits 605R and 605L receive the block select signal BS5 of H level and the equalize control signal BLEQF of H level to output the bit line equalize signal BLEQ of L level after the comparison period Tcomp ends as well. The row decoder 315 activates the word line WL5, 0 to 511 specified by the decoded row address RA0 to RA8 in synchronism with a timing at which the word line control signal RXT is switched to H level. On the other hand, the block select signal generating circuit 325A outputs the block select signal BS7 of L level on the basis of the substitution row select signal SRE0 of L level and the row address RA9=RA10=RA12=0 and RA11=1. Thereby, the block BLK5 is selected to input/output data to/from a memory cell included in the block BLK5.

As described above, in the block select circuit 32A, two blocks are kept in a selected state till a comparison operation in the row redundancy circuit 33A ends and in this state, preparation to activate a word line progresses in each of the blocks. When the comparison period Tcomp ends, selection of one of the blocks is kept according to a result of the comparison to perform data input/output on the selected block.

An select operation of each of the blocks BLK8 to BLK15 in the block select circuit 32B is the same as the select operation of each of the blocks BLK0 to BLK7 in the block select circuit 32A described above.

As shown in FIG. 4, since the blocks BLK0 to BLK6 included in the memory cell region 6 and the blocks BLK8 to BLK14 included in the memory cell region 7 are continuously arranged, small propagation delay is encountered in the block select signals BS0 to BS6 and BS8 to BS14 outputted from the block select circuits 32A and 32B to the blocks BLK0 to BLK6 and blocks BLK8 to BLK14. As a result, even in case where the selection is effected till the comparison period Tcomp ends and after end of the comparison period Tcomp, the selection is switched to non-selection, a period when the bit line equalize signal BLEQ is kept at L level can be constant, thereby enabling a discharge amount in a bit line equalize signal line to be reduced. That is, a semiconductor memory device with low power consumption can be realized.

In the semiconductor memory device 100, data input/output of data to/from a memory cell included in each of the blocks BLK0 to BLK15 is performed such that the blocks BLK0 to BLK15 are selected by operation described above, a word line in a selected one of the blocks BLK0 to BLK15 is activated and thereafter, a bit line is activated by a column decoder 40.

While in the above description, a case of two memory cell regions is shown, there is no specific limitation to this in the present invention, but generally, a case where a plurality of memory cell regions are arranged may be included therein.

According to the first embodiment, since the semiconductor memory device 100 has a configuration in which a plurality of blocks including regular rows without any substitution row are continuously disposed, a propagation delay which occurs on a block select signal outputted to blocks from a block decoder can be reduced, with the result that a semiconductor memory device with low power consumption can be realized.

Furthermore, since two blocks are activated during a comparison period in which a row redundancy circuit compares a programmed row address with an inputted row address and furthermore, one of the activated two blocks continues to be kept activated after the comparison period ends, a high speed semiconductor memory device can be realized.

Second Embodiment

Figure 10:
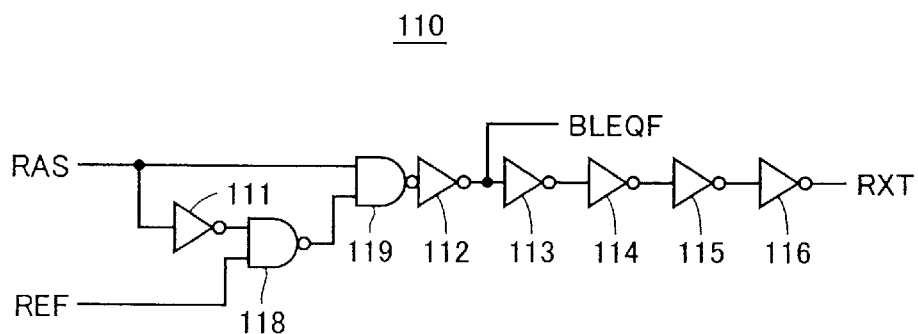
FIG. 10 is a circuit diagram of a control circuit in a second embodiment.

According to the first embodiment, two blocks are activated during the comparison period in which the redundancy circuits 33A and 33B each compare a programmed row address with an inputted row address RA9 to RA12 in order to realize a high speed operation in a semiconductor memory device. For this reason, power consumption in the comparison period increases to some extent. An operation called auto-refresh (alternatively, self-refresh) is performed in SDRAM, in which operation mode no data access is effected but only refresh of memory cells is effected. In a period of the operation, since there is no necessity for a high speed selection of a word line, a block selected by a block decoder is only required to be activated after the comparison operation in a row redundancy circuit ends. For this reason, a control circuit 110 according to the second embodiment has a circuit configuration as shown in FIG. 10. The control circuit 110 is constructed of inverters 111 to 116; and NAND gates 118 and 119. The NAND gate 118 receives a signal REF at one terminal thereof and the signal /RAS obtained by inverting the row address strobe signal RAS at the other terminal thereof. The NAND gate 119 receives an output signal of the NAND gate 118 and the row address strobe signal RAS. The inverter 112 outputs inverts an output signal of the NAND gate 119 to output the inverted signal as the equalize control signal BLEQF. The inverter 116 outputs the word line control signal RXT obtained by delaying the equalize control signal BLEQF by a predetermined time.

Figure 11:
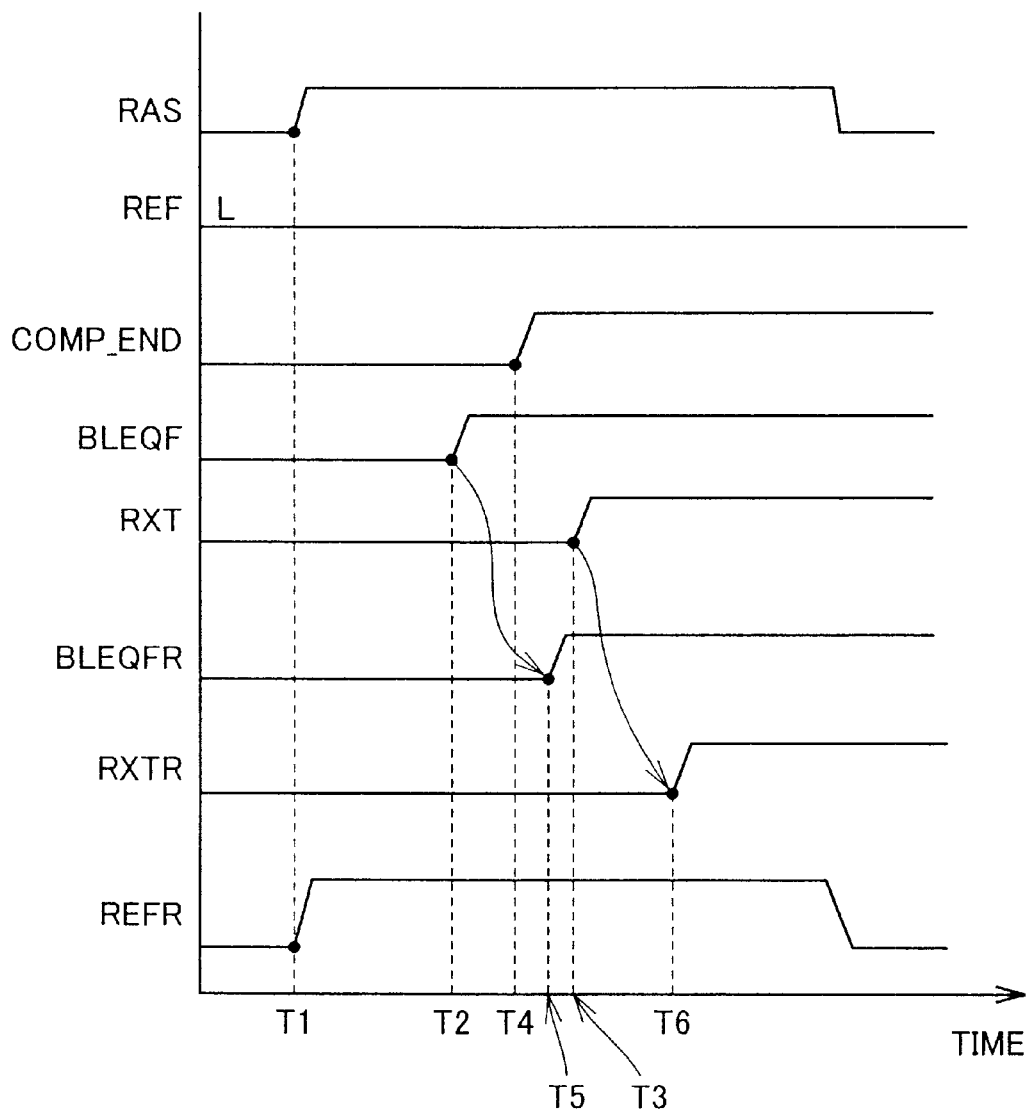
FIG. 11 is a timing chart of signals used in FIGS. 8 and 10.

Referring to FIG. 11, the signal REF is at L level in an ordinary operation and when the row address strobe signal RAS is switched from L level to H level, the equalize control signal BLEQF is switched to H level at a timing T2 later than a timing T1 at which the row address strobe signal RAS goes to H level by a delay time caused by the NAND gate 119 and the inverter 112. The word line control signal RXT is switched from L level to H level at a timing T3 later than a timing T2 at which the equalize control signal BLEQF goes to H level by a delay time caused by the inverters 113 to 116. In this case, a timing T4 at which the comparison operations in the redundancy circuits 33A and 33B end is set between the timings T2 and T3. Therefore, between the timings T2 and T4, the equalize control signal BLEQF goes to H level, the bit line equalize signal BLEQ goes to L level and a block selected by a block select signal is activated.

On the other hand, during an auto-refresh operation, a signal REFR (the signal REF in this period is referred to as "REFR") goes to H level at the timing T1 in synchronism with the row address strobe signal RAS. Thereby, the equalize control signal BLEQFR (the equalize control signal BLEQF in this period is referred to as "BLEQFR") is switched from L level to H level at a timing T5 delayed by a delay time caused by the inverter 111, the NAND gates 118 and 119 and the inverter 112. That is, the equalize control signal BLEQFR is switched from L level to H level at the timing T5 later than the timing T2 at which being switched from L level to H level in the ordinary operation by a delay time caused by the inverter 111 and the NAND gate 119. The timing T5 lags behind the timing T4 at which the comparing operations end in the row redundancy circuits 33A and 33B.

The word line control signal RXTR (the word line control signal RXT in this period is referred to as "RXTR") is switched from L level to H level at a timing T6 later than the timing T3 by a delay time caused by the inverters 113 to 116.

Therefore, even if a block select signal of H level is outputted from the block decoder 32 between the timings T1 and T5, the bit line equalize circuit outputs the bit line equalize signal BLEQ of H level and the block is not activated since the bit line equalize circuit receives the equalize control signal BLEQFR of L level. The comparison operations in the row redundancy circuits 33A and 33B have ended at the timing T5 at which the equalize control signal BLEQFR is switched to H level and as a result of the comparison operation, only a selected block receives a block select signal of H level and the equalize control signal BLEQFR of H level to be activated.

As described above, the control circuit 110 outputs the equalize control signal BLEQFR of L level till the comparison operations in the redundancy circuits 33A and 33B end during the auto-refresh and outputs the equalize control signal BLEQFR of H level after the comparison operations in the row redundancy circuits 33A and 33B end; therefore, only a block selected by the comparison operation can be activated after the comparing operations end in the row redundancy circuit 33A and 33B and as a result, reduced power consumption of a semiconductor memory device can be achieved.

The other points are the same as corresponding points of the description in the first embodiment.

According to the second embodiment, completion of the comparison operation in which a row redundancy circuit compares a programmed row address with an inputted row address is awaited and thereafter, only a block selected by the comparison operation can be activated, thereby enabling a semiconductor memory device with low power consumption to be realized.

Third Embodiment

Figure 12:
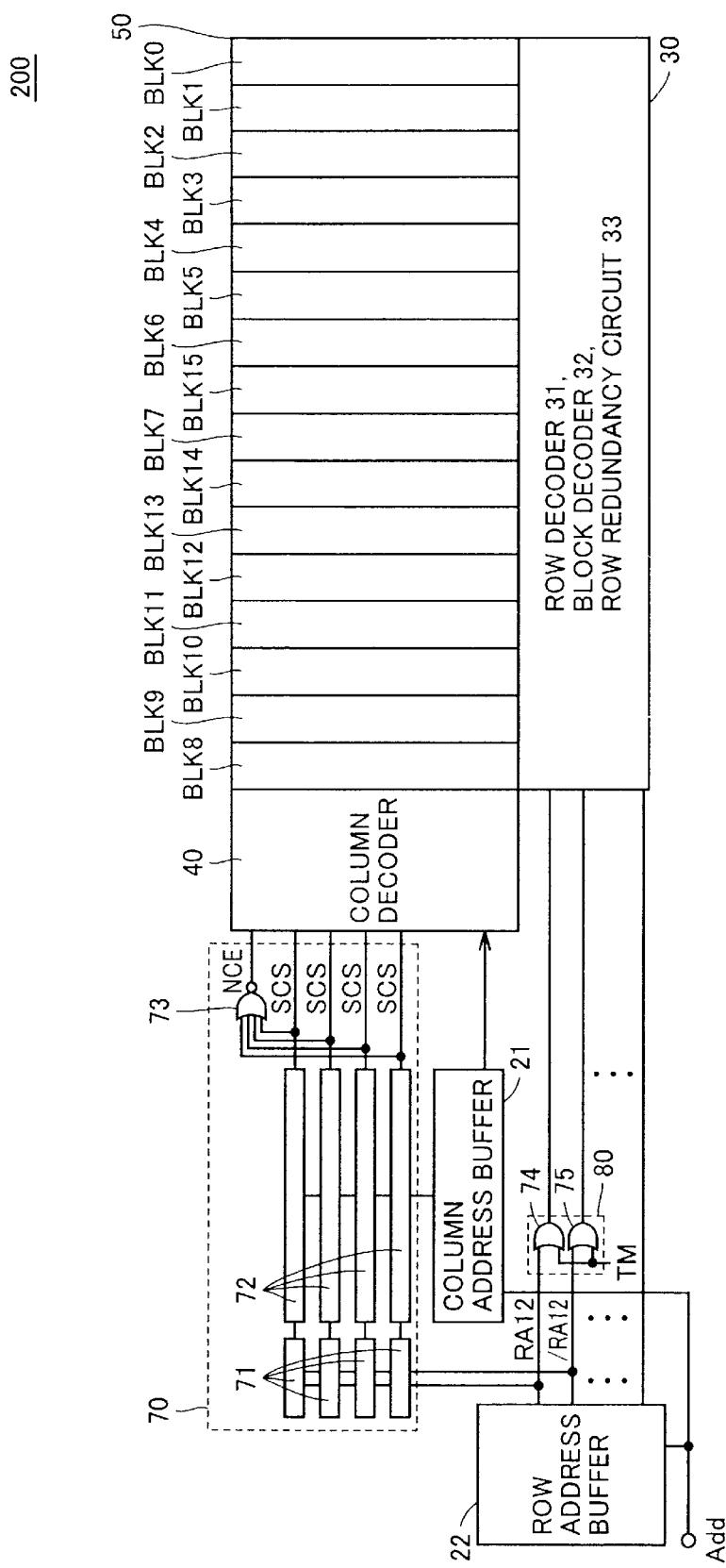
FIG. 12 is a schematic block diagram of a semiconductor memory device according a third embodiment.

Referring to FIG. 12, a semiconductor memory device 200 according to the third embodiment is configured such that a column redundancy circuit 70 and a degeneration circuit 80 are added to the semiconductor memory circuit 100 shown in FIG. 2 and the other constituents in the configuration are the same as corresponding constituents of the configuration of the semiconductor memory device 100.

The column redundancy circuit 70 is constructed of: a storage circuit 71; a comparison circuit 72; and a NOR circuit 73. The storage circuit 71 stores a row address of a defective memory cell included in the memory cell region 6 and a row address of a defective memory cell included in the memory cell region 7 to selectively output the stored row addresses of defective memory cells included in the two memory cell regions by the row addresses RA12 and /RA12 from the row address buffer 22. The degeneration circuit 80 is constructed of: OR gates 74 and 75. The OR gate 74 receives the row address RA12 from the row address buffer 22 and a test mode signal TM to operate an OR operation thereon and output a result of the OR operation to the block decoder 32. The OR gate 75 receives the row address /RA12 from the row address buffer 22 and the test mode signal TM to operate an OR operation thereon and output a result of the OR operation to the block decoder 32.

The test mode signal TM goes to H level when the system transitions to a burn-in test mode while assuming L level in a mode other than the burn-in test mode. Therefore, the degeneration circuit 80 degenerates the row addresses RA12 and /RA12 to output a signal of H level to the decoder 32 during the burn-in test period while outputting the row addresses RA12 and /RA12 to the decoder 32 without any change therein except the burn-in test period. The row address buffer 22 outputs the row address RA0 to RA8 without any change therein to the row decoder 31 and the row redundancy circuit 33.

Figure 13:
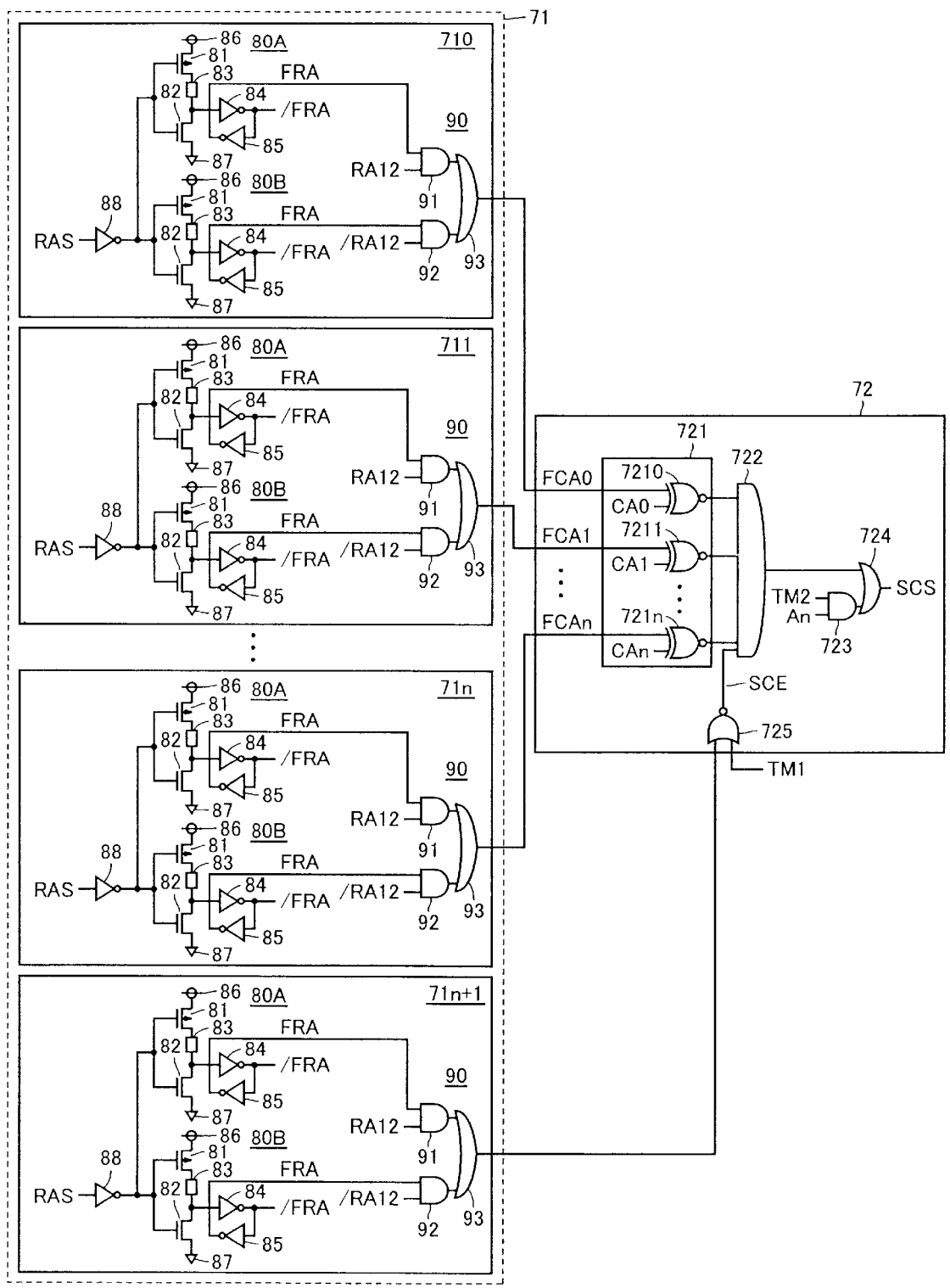
FIG. 13 a circuit diagram of a storage circuit and comparison circuit combined of a column redundancy circuit shown in FIG. 12.

Referring to FIG. 13, the storage circuit 71 is constructed of storage unit circuits 710 to 71n+1. The storage unit circuits 710 to 71n+1 are each constructed of: program circuits 80A and 80B; an inverter 88; and a select circuit 90. The program circuits 80A and 80B are each constructed of: a P channel MOS transistor 81; an N channel MOS transistor 82; a fuse 83; inverters 84 and 85. The P channel MOS transistor 81, an N channel MOS transistor 82 and the fuse 83 are connected in series between a power source node 86 and a ground node 87. The P channel MOS transistor 81 is provided in the power source node 86 side while the N channel MOS transistor 82 is provided in the ground node 87 side and the fuse 83 is located between the P channel MOS transistor 81 and the N channel MOS transistor 82. The P channel MOS transistor 81 and the N channel MOS transistor 82 receive the signal /RAS obtained by inverting the row address strobe signal RAS at the gate terminals thereof. The inverters 84 and 85 constitute a latch circuit. An input terminal of the inverter 84 is connected to a node between the N channel MOS transistor 82 and the fuse 83 and a programmed column address FRA is outputted from the node. The fuse 83 is a fuse which can be blown by irradiation with laser light.

In the standby, the program circuits 80A and 80B are reset by receiving the signal /RAS of H level obtained by inverting the row address strobe signal RAS of L level to turn off the P channel MOS transistor 81 and turn on the N channel MOS transistor 82. When a memory cycle gets started, the program transistors 80A and 80B outputs the column address FRA of L or H level according to whether or not the fuse 83 has been blown by receiving the signal /RAS of L level obtained by inverting the row address strobe signal RAS of H level to turn on the P channel MOS transistor 81 and turn on the N channel MOS transistor 82.

The select circuit 90 is constructed of: AND gates 91 and 92; and an OR gate 93. The AND gate 91 receives the column address FRA from the program circuit 80A and the inputted row address RA12. The AND gate 92 receives the column address FRA from the program circuit 80B and the inputted row address /RA12. The OR gate 93 operates an OR operation on an output signals of the AND gates 91 and an output of the AND gate 92 to output a result of the OR operation.

The select circuit 90 selects the column address FRA from the program circuit 80B through the AND gate 92 to output when the region address RA12=0 specifying the memory cell region 6 is inputted. Furthermore, the select circuit 90 selects the column address FRA from the program circuit 80A through the AND gate 91 to output when the region address RA12=1 specifying the memory cell region 7 is inputted. Therefore, the program circuit 80A stores one bit of the column address of a defective memory cell included in the memory cell region 7 and the program circuit 80B stores one bit of the column address of a defective memory cell included in the memory cell region 6.

Therefore, the storage circuit 71 stores a column address of a defective memory cell included in the memory cell region 7 (a region specified by the region address RA12=1) using the n+1 program circuits 80A of the storage unit circuits 710 to 71n and a column address of a defective memory cell included in the memory cell region 6 (a region specified by the region address RA12=0) using the n+1 program circuits 80B of the storage unit circuits 710 to 71n. The storage unit circuit 71n+1 stores information on whether or not a column address of a defective memory cell stored by the storage unit circuits 710 to 71n is effective. That is, when a column address of a defective memory cell included in the memory cell region 6 is effective, the fuse 83 of the program circuit 80B has been blown, while when a column address of a defective memory cell included in the memory cell region 7 is effective, the fuse 83 of the program circuit 80A has been blown. Therefore, the storage unit circuit 71n+1 outputs a signal of L level from the program circuit 80B when receiving the region address RA12=0, while the storage unit circuit 71n+1 outputs a signal of L level from the program circuit 80A when receiving the region address RA12=1. Note that when a column address stored in the storage unit circuits 710 to 71n is not effective, neither of the fuses 83 of the program circuits 80A and 80B of the storage unit circuit 71n+1 are blown; therefore, the storage unit circuit 71n+1 outputs a signal of H level.

The comparison circuit 72 is constructed of: a coincidence detecting circuit 721; AND gates 722 and 723; an OR gate 724; and a NOR gate 725. The coincidence detecting circuit 721 is constructed of: an EX-OR gates 7210 to 721n. The EX-OR gates 7210 to 721n judge whether or not a column address FCA0 to FCAn from the storage circuit 71 coincides with an inputted column address CA0 to CAn in respective address bits. If coincidence arises, then each of the EX-OR gates outputs a signal of H level, and if no coincidence arises, then each of the EX-OR gates outputs a signal of L level. The NOR gate 725 performs an OR operation on the test mode signal TM1 and an output signal of the storage unit circuit 71n+1 to output a signal obtained by inverting a result of the OR operation. The test mode signal TM1 is basically a signal of L level during a burn-in test. Therefore, the NOR gate 725 outputs a signal of H level when the storage unit circuit 71n+1 outputs a signal of L level. Hence, the AND gate 722 outputs a signal corresponding to a logical level of an output signal from the coincidence detecting circuit 721.

The AND gate 723 performs an AND operation on a test mode signal TM2 and a column address An of a substitution column. The test mode signal TM2 is basically at L level during a burn-in test. Therefore, the OR gate 724 outputs a signal corresponding to a logical level of an output signal from the AND gate 722 as the substitute column activating signal SCS.

The storage circuit 71 outputs the column address FCA0 to FCAn stored in the program circuits 80A or 80B from the respective storage circuits 710 to 71n and outputs a signal of L level showing that the stored column address from the storage unit circuit 71n+1 is effective when region address RA12 and RA/12 is inputted from row address buffer. In the comparison circuit 72, the coincidence detecting circuit 721 detects whether or not the column address FCA0 to FCAn from the storage circuit 71 coincide with the inputted column address CA0 to CAn and if coincidence arises, then a signal of H level is outputted. The AND gate 722 performs an AND operation on a signal of H level from the NOR gate 725 and a signal of H level from the coincidence detecting circuit 721 to output a result of the AND operation to the OR gate 724. Thereby, the OR gate 724 outputs a signal of H level from the AND gate 722 since the OR gate 724 usually receives a signal of L level from the AND gate 723. That is, in this case, the comparison circuit 72 outputs the activated substitute column activating signal SCS.

On the other hand, when the coincidence detecting circuit 721 outputs a signal of L level, the AND gate 722 outputs a signal of L level and the OR gate 724 outputs a signal of L level. That is, in this case, the substitute column activating signal SCS is deactivated.

Referring again to FIG. 12, the 4 storage circuits 71 and the 4 comparison circuits 72 of the column redundancy circuit 70 compare the programmed column address FCA0 to FCAn described above with an inputted column address to output a result of the comparison as the substitution column activating signal SCS. The NOR gate 73 outputs a signal NCE of L level to the column decoder 40 when at least one substitute column activating signal of H level is outputted from the 4 comparison circuits 72 and outputs a signal NCE of H level to the column decoder 40 when the substitution column activating signals SCS of L level are outputted from all of the respective 4 comparison circuits 72. Furthermore, the 4 comparison circuits 72 output the respective substitution column activating signals SCS to the column decoder 40.

Figure 14:
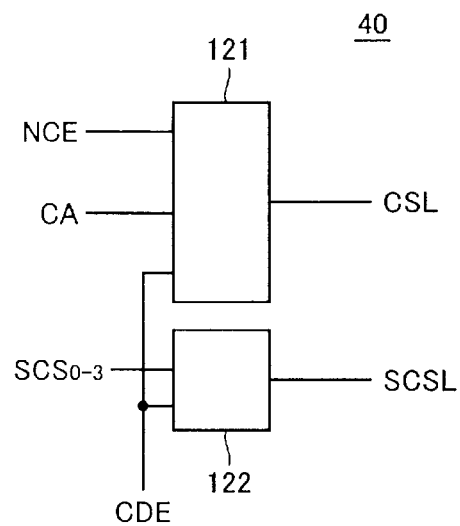
FIG. 14 is a schematic block diagram of a column decoder shown in FIG. 12.

Referring to FIG. 14, the column decoder 40 is constructed of: a regular column decoder 121; and a spare column decoder 122. The regular decoder 121 is activated by a column decoder enable signal CDE and when receiving the signal NCE of H level and a column address CA from the column address buffer 21, decodes the column address CA and activates a column select line CSL specified by the decoded column address. On the other hand,, the regular column decoder 121 does not decode the column address CA when receiving the signal NCE of L level.

The spare column decoder 122 is activated by the column decoder enable signal CDE to activate a spare column select line SCSL specified by the substitution column activating signals SCS0 to SCS3 from the 4 comparison circuits 72.

Therefore, when the substitution column activating signals SCS at least one of which is at H level are outputted from the 4 comparison circuits 72, the regular column decoder 121 of the column decoder 40 is deactivated and the spare column decoder 122 activates a substitution column specified by the activated substitution column activating signal SCS0 to SCS3. When the substitution column activating signals SCS0 to SCS3, all of which are at L level, are outputted from the 4 comparison circuits 72, the spare column decoder 122 is deactivated and the regular decoder 121 is activated, and the regular column decoder 121 activates a column select line CSL specified by an inputted column address.

In a burn-in rest, since the test mode signal TM of H level is inputted, the degeneration circuit 80 degenerates the region addresses RA12 and /RA12 to output signals of H level to the block decoder 32. Therefore, the block decoder 32 activates the blocks BLK0 to BLK15 specified by the block address RA9 to RA11 included in the memory cell region 6 and the block BLK0 to BLK15 specified by the block address RA9 to RA11 included in the memory cell region 7. A row decoder corresponding to an activated block included in the memory cell region 6 activates a word line specified by the row address RA0 to RA8 included in the activated block while a row decoder corresponding to an activated block included in the memory cell region 7 activates a word line specified by the row address RA0 to RA8 included in the activated block. That is, during the burn-in test, two blocks having the same block address included in respective two memory cell regions 6 and 7 are simultaneously activated and two word lines having the same row address included in the respective two activated blocks are simultaneously activated.

Figure 15:
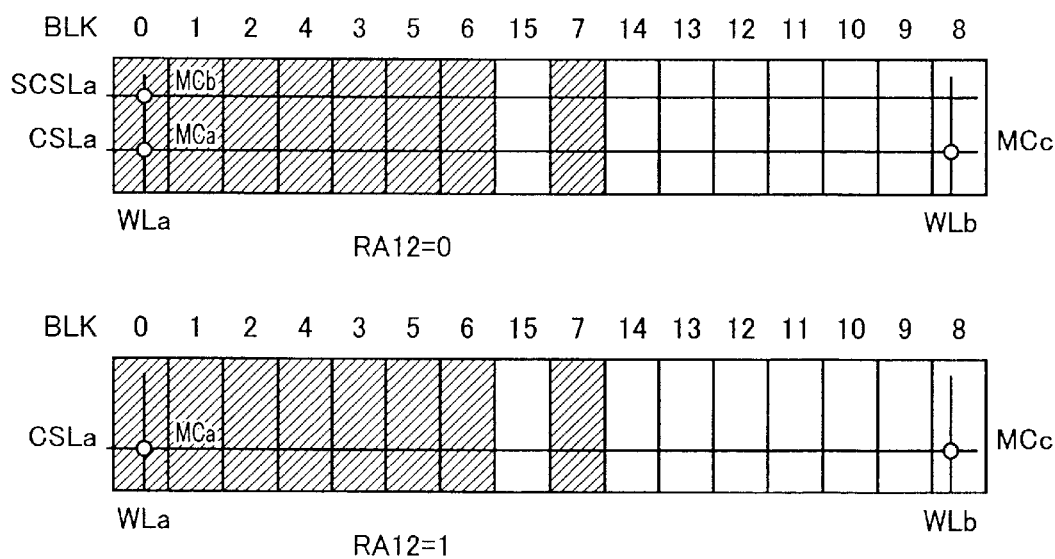
FIG. 15 is drawings representing arrangement of memory cells activated in a burn-in test.

As shown in FIG. 15, during the burn-in test, it is assumed that activation is performed of a word line WLa of the block BLK0 included in the memory cell region 6 and a word line WLb of the block BLK8 included in the memory cell region 7. It is assumed that in the memory cell region 6 (the region address RA12=0), a spare column select line SCSLa is selected instead of a column select line CSLa and in the memory cell region 7 (region address RA12=1), the column select line CSLa is selected. Then, the burn-in test is performed such that in the memory cell region 6, activation is performed of a memory cell MCb specified by the word line WLa and the spare column select line SCSLa and in the memory cell region 7, activation is performed of a memory cell MCc specified by the word line WLa and the column select line CSLa.

In such a way, by inputting the non-degenerated region address RA12 to the column redundancy circuit 70 and the degenerated region address RA12 to the block decoder 32, two memory cells included in the respective two regions 6 and 7 can be synchronously tested in a burn-in test.

Referring again to FIG. 13, in a burn-in test period, one run of the burn-in test is performed by inputting the test mode signal TM1 of H level to the NOR gate 725 of the comparison circuit 72 to deactivate the substitution column activating signal SCS to activate a column select line specified by an inputted column address. Then, another run of the burn-in test can be performed by inputting the test mode signal TM2 of H level to the AND gate 723 while keeping the test mode signal TM1 at H level to activate a column select line specified by a column address An of a substitution column. In such a way, the burn-in test can be performed on all of the memory cells. Therefore, the test modes performed by the test mode signals TM1 and TM2 are test modes in which all of the memory cells are tested without detecting whether or not a column address programmed in the storage circuit 71 coincides with an inputted column address.

While in the above description, the case of the two memory cell regions 6 and 7 is shown, according to the present invention, there is no specific limitation to the case but generally in a case where a plurality of memory cell regions are disposed as well, a plurality of memory cell regions can be simultaneously activated to perform a burn-in test.

According to the third embodiment, since in a semiconductor memory device, a non-degenerated row address (a region address) is inputted to a column redundancy circuit and a degenerated row address (a region address) is inputted to a block decoder, memory cells of the same address in respective plural regions can be simultaneously activated to perform a burn-in test. As a result, a burn-in test can be completed in a short time.

Fourth Embodiment

A burn-in test is performed after a semiconductor memory device is sealed in a package and there are many cases where defective memory cells detected in a burn-in test amounts to several bits; therefore, in some of the cases, addresses of the detected defective memory cells are programmed in a storage circuit.

Since in the program circuits 80A and 80B of the storage circuit 71, the fuses 83 that can be blown by irradiation with laser light are used, addresses of defective memory cells cannot be programmed in the program circuits 80A and 80B after a semiconductor memory device is sealed in a package.

Figure 16:
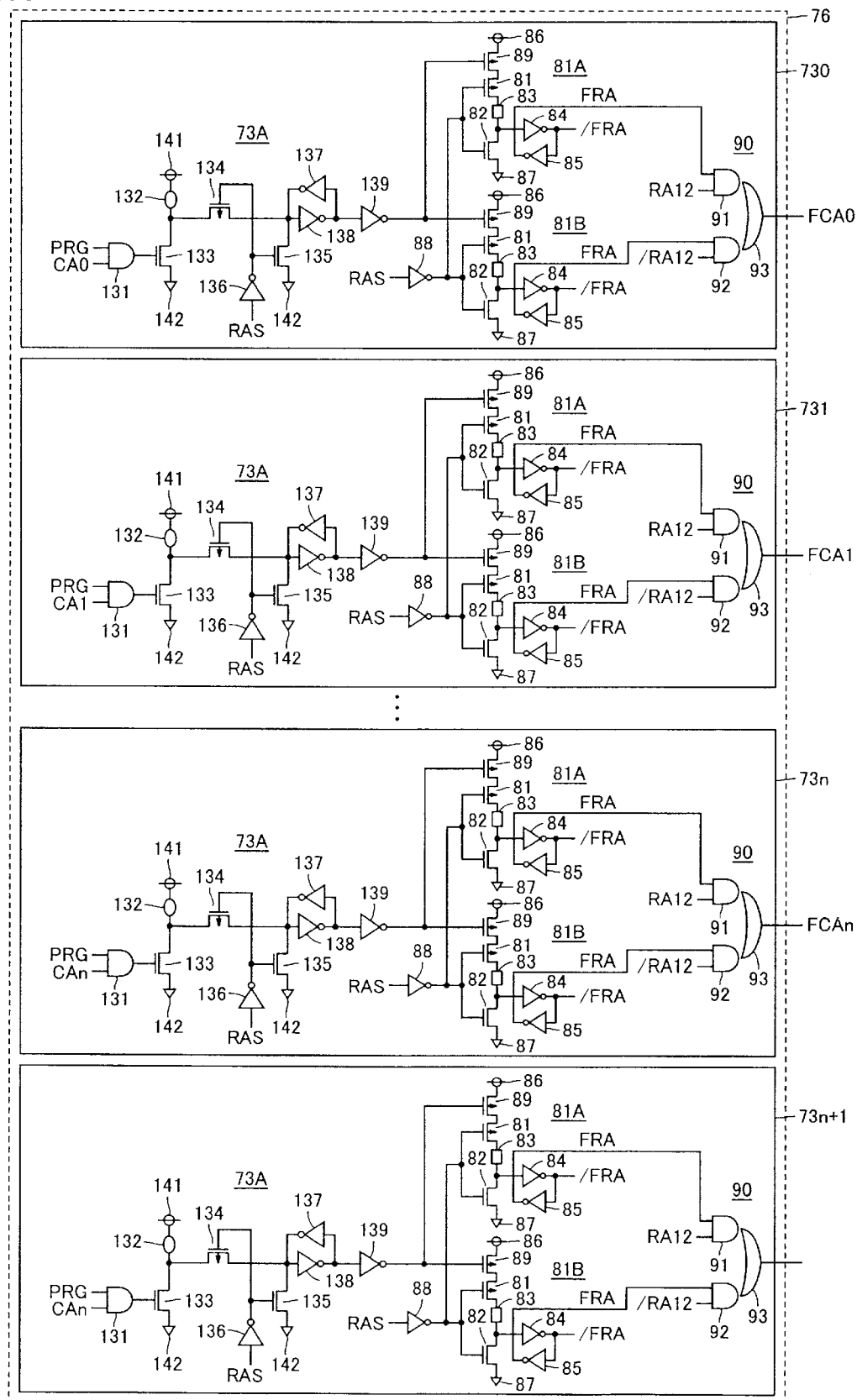
FIG. 16 is a circuit diagram of a storage circuit included in a column redundancy circuit according to a fourth embodiment.

Therefore, one storage circuit of the 4 storage circuits 71 of the column redundancy circuit 70 is replaced with a storage circuit 76 shown in FIG. 16.

Referring to FIG. 16, the storage circuit 76 is constructed of storage unit circuits 730 to 73n+1. Each of the storage unit circuits 730 to 73n+1 is constructed of: program circuits 73A, 81A and 81B; an inverter 88; and a select circuit 90. The inverter 88 and the select circuit 90 are the same as those in the third embodiment.

The program circuit 73A is constructed of: an AND gate 131; a fuse 132; N channel MOS transistors 133 and 135; a P channel MOS transistor 134; and inverters 136 to 139. The fuse 132 and the N channel MOS transistor 133 are connected in series between a power source node 141 and a ground node 142. The N channel MOS transistor 133 receives an output signal of the AND gate 131 at its gate terminal. The inverters 137 and 138 constitute a latch circuit. The N channel MOS transistor 135 is connected between an output terminal of the inverter 137 (or an input terminal of the inverter 138) and the ground node 142. The N channel MOS transistors 134 and 135 receive the signal /RAS obtained by inverting the row address strobe signal RAS at the gates thereof. In the AND gate 131, a signal PRG is a signal of H level during the programming.

Figure 17A:
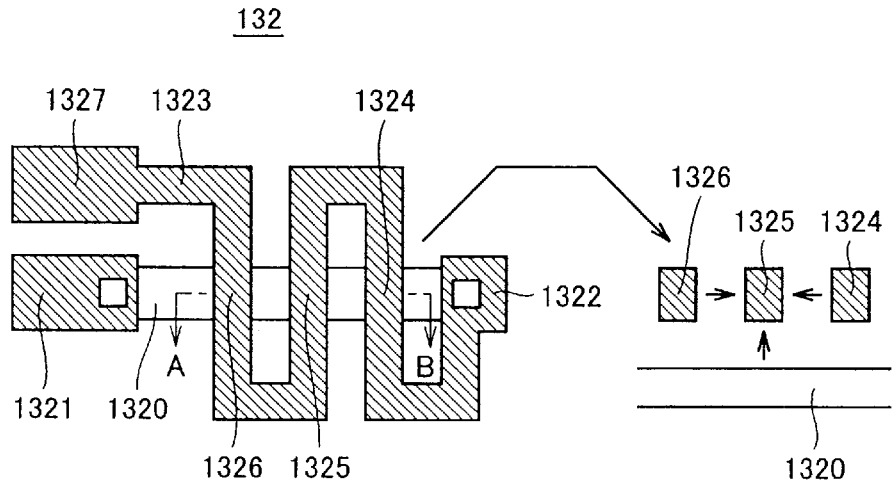
FIG. 17A is a plan view and sectional view of a fuse which can be blown electrically and FIG. 17B is a sectional view to taken on line A–B of FIG. 17A.
Figure 17B:
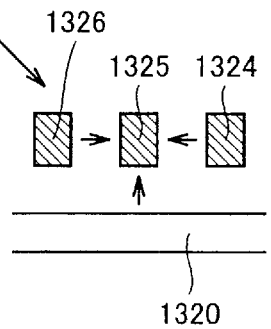

The fuse 132 is a fuse that can be blown by either irradiation with laser or supply of a current. Referring to FIG. 17, the fuse 132 is constructed of: a tungsten nitride interconnect 1320; and an aluminum interconnect 1323. The fuse 132 shown in FIG. 17 is fabricated using two layers among interconnection layers used in a DRAM. The tungsten nitride interconnect 1320 is that constituting a cell plate which is an opposite electrode of a memory cell and the aluminum interconnect 1323 is an aluminum interconnect in the first layer of a DRAM. Therefore, the aluminum interconnect 1323 is formed in a layer higher than the tungsten nitride interconnect 1320. The tungsten nitride interconnect 1320 has contact sections 1321 and 1322 and is connected to the aluminum interconnect 1323 through the contact section 1322. The aluminum interconnect 1323 meanders between the contact section 1322 and a terminating portion 1327. By supplying a current in a direction from the contact section 1321 to the contact section 1322, the current flows through the aluminum interconnect 1323 in the direction from the contact section 1322 to the terminating portion 1327 (see FIG. 17A). In such a situation, a straight line portion 1325 of the aluminum interconnect 1323 is easy to be blown by heat supplied from straight portions 1324 and 1326 located on both sides thereof. The reason why will be described with reference to FIG. 17B. FIG. 17B is a sectional view taken on line A–B of FIG. 17A. The straight portion 1325 is easier to be heated to the melting point than the other portions by heat from the straight portions 1324 and 1326 and the tungsten nitride interconnect 1320 of a underlying layer thereof As a result, the straight portion 1325 is easier to be blown. The fuse 132, in such a way, is a fuse that can be blown with ease by supply of a current.

Referring again to FIG. 16, during the programming, the AND gate 131 receives the signal PRG of H level and a column address CAi of a defective memory cell inputted externally to output a signal of H level when the column address CAi is at H level. With output of the signal of H level, the N channel MOS transistor 133 is turned on to flow a current through the fuse 132 from the power source node 141 to the ground node 142. Thereby, the fuse 132 is blown and the column address CAi is written in. On the other hand, when a column address CAi of L level is inputted, the AND gate 131 outputs a signal of L level to turn off the N channel MOS transistor 133; therefore, the fuse 132 is not blown. In such a way, [1] or [0] is written in by whether or not the fuse 132 is blown.

After the programming period ends, the signal PRG goes to L level and the AND gate 131 outputs a signal of L level; therefore, the N channel MOS transistor 133 is turned off.

Since the row address strobe signal RAS is at L level when the semiconductor memory device is in the standby state, the P channel MOS transistor 134 is turned off and the N channel MOS transistor 135 is turned on. As a result, the program circuit 73A is reset.

When a memory cycle gets started, the row address strobe signal RAS goes to H level, the N channel MOS transistor 135 is turned on, the P channel MOS transistor 134 is turned on and the program circuit 73A outputs a signal of L level when the fuse 132 has been blown. On the other hand, when the fuse 132 has not been blown, the program circuit 73A outputs a signal of H level.

The program circuits 81A and 81B are each configured such that a P channel MOS transistor 89 is inserted between the P channel MOS transistor 81 and the power source node 86 in each of the program circuits 80A and 80B shown in FIG. 13 and the other portion of the configuration is the same as that of the program circuits 80A and 80B. The P channel MOS transistor 89 receives an output signal from the program circuit 73A at its gate terminal.

Since, when the fuse 132 has been blown, the program circuit 73A outputs a signal of L level, the P channel MOS transistors 89 of the program circuits 81A and 81B are both turned on. In a memory cyde, since the row address strobe signal RAS is at H level, the P channel MOS transistors 81 in the program circuits 81A and 81B are both turned on, while the N channel MOS transistors 82 therein are both turned off. Therefore, the program circuits 81A and 81B each output the column address FRA of H level.

On the other hand, when the fuse 132 is in a state of no blowing, the program circuit 73A outputs a signal of H level; therefore, the P channel MOS transistors 89 in the program circuits 81A and 81B are both turned off. As a result, no current flows from the power source nodes 86 to the fuses 83, and the program circuits 81A and 81B each outputs the column address FRA of L level.

The select circuits 90 each select the column address FRA from a program circuit 81B through an AND gate 92 when the region address RA12=0, while selecting the column address FRA from a program circuit 81A through an AND gate 91 when the region address RA12=1.

Therefore, the storage unit circuit 730 outputs the column address FCA0 of H level when the fuse 132 of the program circuit 73A has been blown, while outputting the column address FCA0 of L level when the fuse 132 of the program circuit 73A has not been blown. Each of the other storage unit circuits 731 to 73n as well outputs the column address FCA1 to FCAn of H or L level similarly to the case of the storage unit circuit 731. The program circuit 73A of the storage unit circuit 73n+1 stores information on whether or not a column address of a defective memory cell stored in the storage unit circuits 730 to 73n is effective. In this case, the information shows that the stored column address is effective when the fuse 132 is in a state of blowing or that the stored column address is not effective when the fuse 132 is in a state of no blowing. Therefore, the storage unit circuit 72n+1 outputs a signal of H level when the stored column address is effective, while outputting a signal of L level when the stored column address is not effective.

Note that while the storage circuit 76 shown in FIG. 16 is of a configuration in which only one column address is stored, detected column addresses of a plurality of defective memory cells can be electrically programmed after the packaging if a plurality of storage circuits 71 among the 4 storage circuits 71 shown in FIG. 12 are replaced with the same circuits as the storage circuit 76 shown in FIG. 16 in coping with a case where a plurality of memory cells are detected as defective by a burn-in test after the packaging of a semiconductor memory device.

Figure 18:
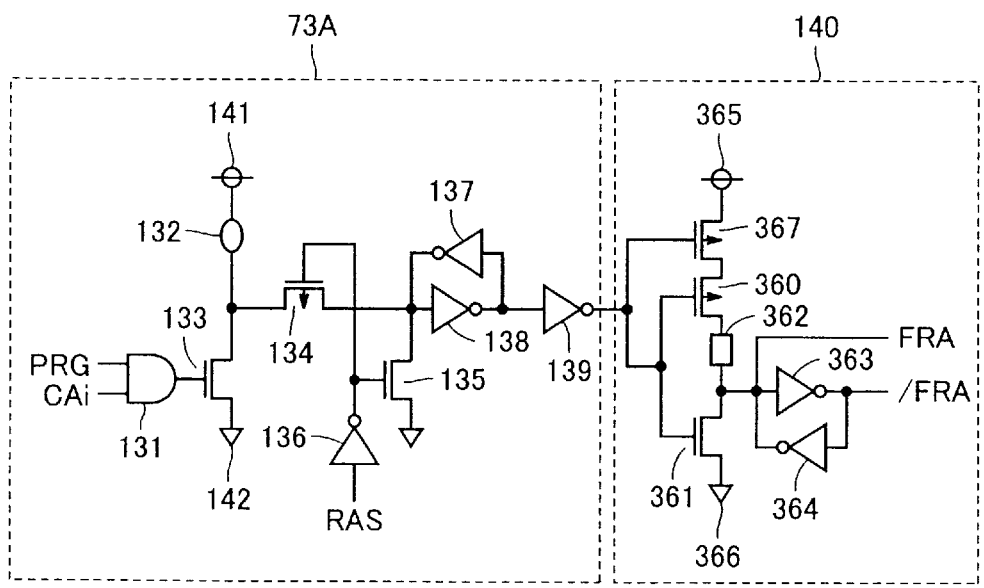
FIG. 18 is a circuit diagram of a storage circuit included in a row redundancy circuit in the fourth embodiment.

Furthermore, in the fourth embodiment, it also works that the program circuits 340 to 34n (see FIG. 5) included in the comparison circuit 330 of the row redundancy circuit 33 may be replaced by the program circuits 370 to 37n shown in FIG. 18. The program circuits 370 to 37n are each constructed of the program circuits 140 and 73A. The program circuit 73A is configured as described above. The program circuit 140 is configured such that a P channel MOS transistor 367 is inserted between the P channel MOS transistor 360 and the power source node 365 in each of the program circuits 340 to 34n shown in FIG. 5 and the other portion of the configuration is the same as that of the program circuits 340 to 34n, wherein the fuse 362 is in a state of no blowing. The P channel MOS transistors 360 and 367, and the N channel MOS transistor 361 receive an output signal of the program circuit 73A at the gate terminals.

When the fuse 132 has been blown, the program circuit 73A outputs a signal of L level; therefore, the P channel MOS transistors 360 and 367 are turned on, while the N channel MOS transistor 361 is turned off, in the program circuit 140. As a result, the program circuit 140 outputs the row address FRA of H level. When the fuse 132 is in a state of no blowing, the program circuit 73A outputs a signal of H level; therefore, the P channel MOS transistors 360 and 367 are turned off, while the N channel MOS transistor 361 is turned on, in the program circuit 140. As a result, the program circuit 140 outputs the row address FRA of L level.

Therefore, by using the program circuits 350 to 35n as program circuits included in the comparison circuit 330 of the row redundancy circuit 33, a row address of a defective memory cell detected in a burn-in test after packaging of a semiconductor memory device can be electrically programmed.

Figure 19:
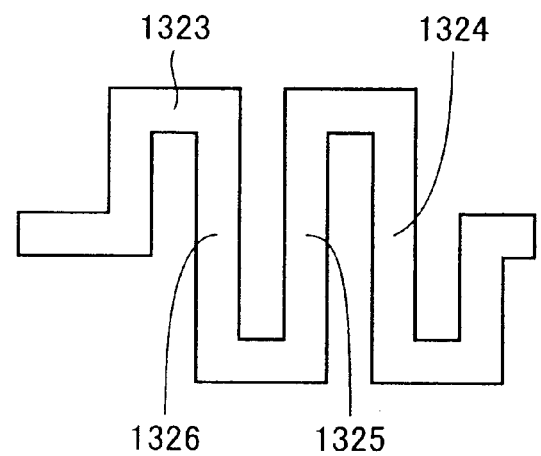
FIG. 19 is a plan view and sectional view of another fuse which can be blown electrically.

Note that the fuse 132 of the program circuit 73A is not limited to that shown in FIG. 17, but may be a fuse 132A shown in FIG. 19. The fuse 132A has a structure in which an aluminum interconnect 1323 of the fuse 132 is included in a single layer. In the fuse 132A, a straight line portion 1325 is easy to be blown by heat from straight portions 1324 and 1326 on both sides thereof caused by supply of a current.

Figure 20:
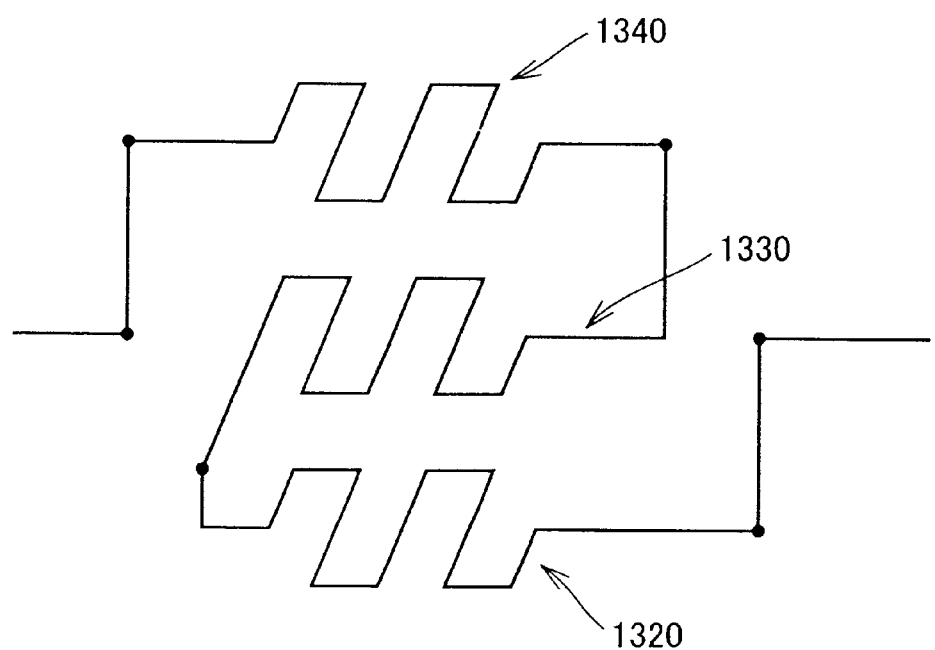
FIG. 20 is a plan view and sectional view of still another fuse which can be blown electrically.
Figure 21:
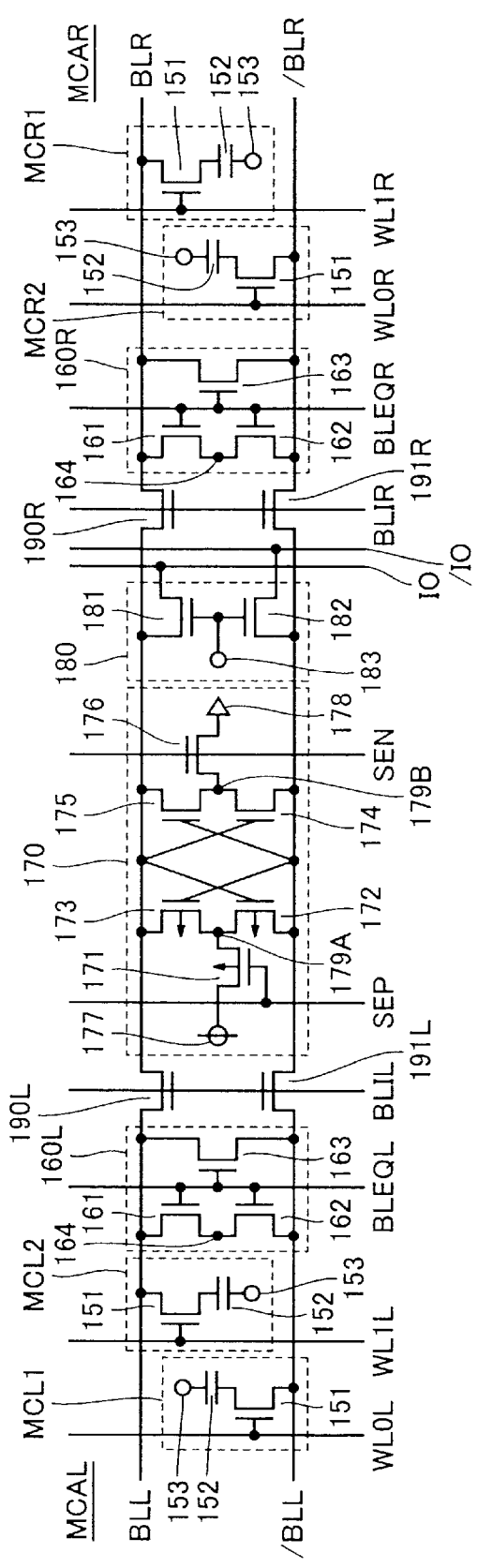
FIG. 21 is a circuit diagram of a memory cell array in which shared sense amplifiers are disposed.
Figure 22:
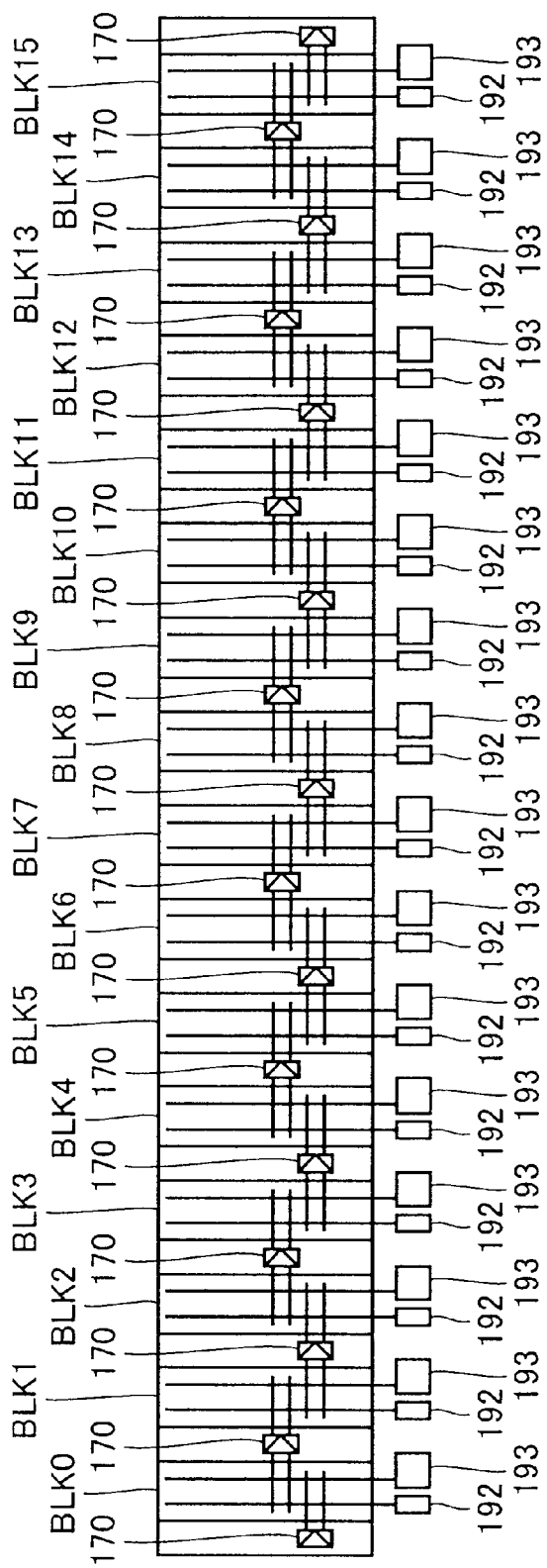
FIG. 22 is a diagram representing prior art arrangement of blocks.
Figure 23:
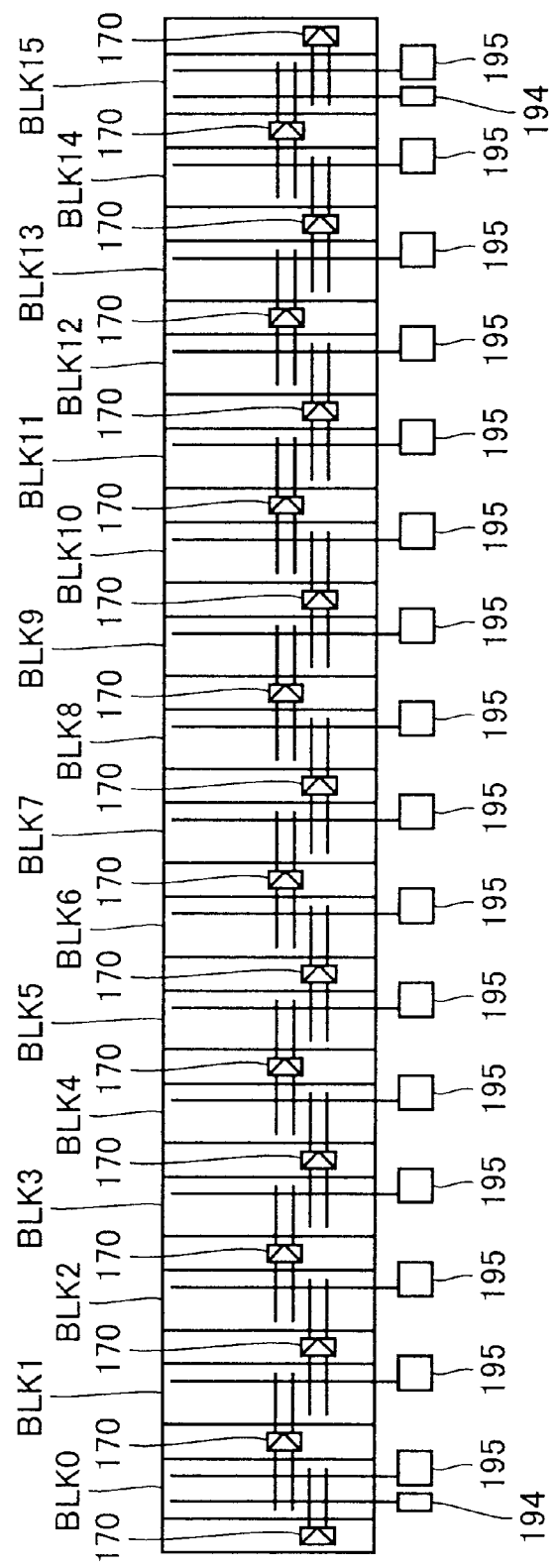
FIG. 23 is a drawing representing another prior art arrangement of blocks.
Figure 24:
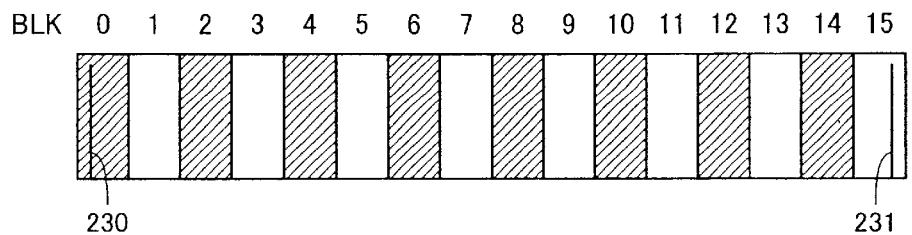
FIG. 24 is a drawing representing locations of substitution rows in a prior art arrangement of blocks.
Figure 25:
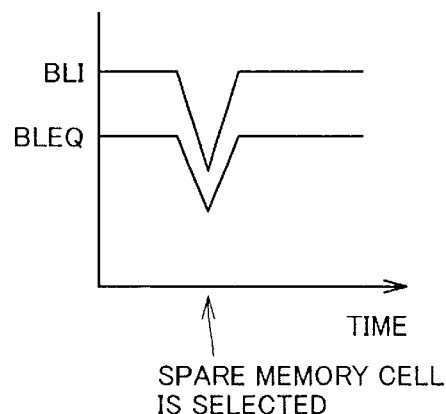
FIG. 25 is a timing chart of a bit line equalize signal and a bit line select signal.
Figure 26A:
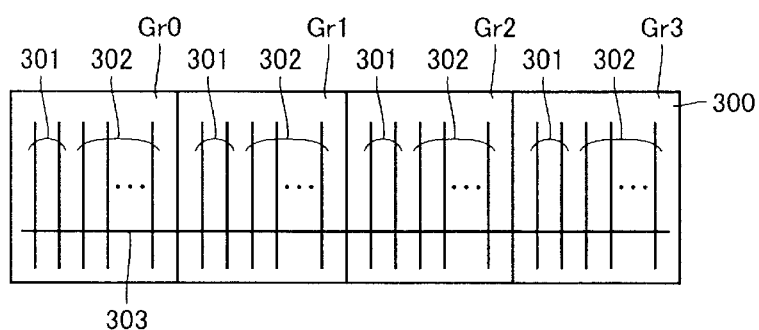
FIGS. 26A and 26B are drawings for describing problems in a burn-in test on a prior art configuration.
Figure 26B:
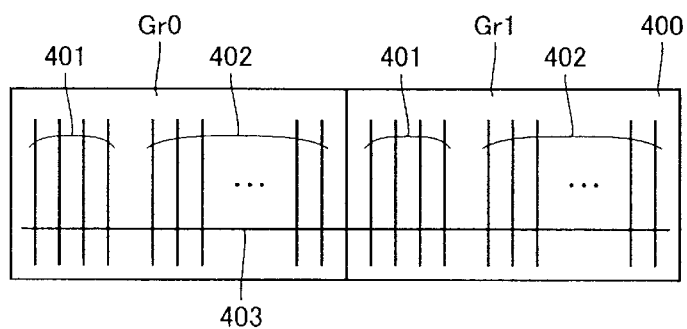

Furthermore, the fuse 132 of the program circuit 73A may be a fuse 132B shown in FIG. 20. The fuse 132B has a structure constructed by sequentially stacking a tungsten nitride interconnect 1320, and aluminum interconnects 1330 and 1340. The aluminum interconnects 1330 and 1340 each have the same structure as that of the aluminum interconnect 1323. In the fuse 132B, the straight line portion 1325 of the aluminum interconnects 1330 and 1340 is easy to be blown; especially a straight portion 1325 of the aluminum interconnect 1330 is easy to be blown.

In the present invention, the program circuit 73A that can also be electrically programmed may be included in any of a column redundancy circuit and a row redundancy circuit, or may be included in both.

According to the fourth embodiment, since a semiconductor memory device includes a program circuit capable of electrically programming an address, an address of a defective memory cell detected in a test after packaging a semiconductor memory device can be programmed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising a plurality of regions, each of said plurality of regions comprising:

a plurality of memory cell regions each comprising a first block including substitution rows on which first memory cells are arranged in a row direction and regular rows on which second memory cells are arranged in the row direction, and a plurality of second blocks each comprising said regular rows without any substitution row;

a plurality of row redundancy circuits provided correspondingly to said respective plurality of memory cell regions and each comparing a row address of a defective memory cell with an inputted row address to output a substitution row activating signal activating/deactivating one of said substitution rows and a substitution row select signal indicating the presence or absence of selection of one of said substitution rows on the basis of a result of the comparison;

a block decoder receiving said substitution row select signal to generate a block select signal from said substitution row select signal for selectively activating/deactivating a first block and a plurality of second blocks included in a memory cell region corresponding to a redundancy circuit outputting said substitution row select signal received and output said block select signal to a first block and a plurality of second blocks included in a corresponding memory cell region;

a plurality of substitution row decoders provided correspondingly to a plurality of first blocks included in said plurality of memory cell regions to each activate/deactivate one of said substitution rows on the basis of said block select signal and said substitution row activating signal;

a plurality of row decoders provided correspondingly to a plurality of second blocks included in said plurality of memory cell regions to each activate/deactivate one of said regular rows on the basis of said block select signal and a row address signal;

a column redundancy circuit comparing a column address of a defective memory cell with an inputted column address to generate a substitution column activating signal for activating/deactivating a substitution column to which a memory cell substituted for said defective memory cell is connected on the basis of a result of the comparison;

a substitution column decoder activating/deactivating said substitution column on the basis of said substitution column activating signal; and a column decoder activating/deactivating a regular column on the basis of a column address, wherein said first memory cells each being a memory cell substituted for a defective memory cell among a plurality of second memory cells included in said first block and said plurality of second blocks;

said column redundancy circuit comprises:

a storage circuit storing a column address of a defective memory cell included in said first block and said plurality of second blocks in each of said plurality of memory cell regions and selectively outputting the stored column address according to a region address specifying one of said plurality of memory cell regions; and a comparison circuit comparing a column address outputted from said storage circuit with said inputted column address to output said substitution column activating signal; and in a period of a burn-in test, said block decoder receives a degenerated region address to output a block select signal for simultaneously activating a plurality of blocks specified by the same block address included in said plurality of memory cell regions; and said storage circuit selectively outputs said column address stored therein corresponding to a memory cell region specified by said region address.

2. The semiconductor memory device according to claim 1, wherein said storage circuit further outputs a correspondence signal showing whether or not an outputted column address is a column address corresponding to a memory cell region specified by said region address and said comparison circuit outputs said substitution column activating signal when receiving a correspondence signal showing that a column address outputted from said storage circuit is a column address corresponding to a memory cell region specified by said region address.

3. The semiconductor memory device according to claim 2, further comprising:

a row address buffer latching an address signal to output a row address of n (n is a natural number) bits; and a degeneration circuit outputting a degenerated signal of k bits (k is a natural number satisfying $1 \leq k < n$) by degenerating a row address of k bits included in said row address of n bits, wherein said block decoder receives said degenerated signal and a block address of m (m is a natural number satisfying $1 \leq m < n-k$) bits, said row decoder receives a row address of n−k−m bits from said row address buffer and said storage circuit receives a row address of k bits from said row address buffer.

4. The semiconductor memory device according to claim 1, wherein said comparison circuit outputs a deactivated substitution column activating signal when receiving an activated first test mode signal and further outputs a substitution column activating signal activating a substitution column specified by a column address of said substitution column when receiving an activated second test mode signal.

5. The semiconductor memory device according to claim 4, wherein said comparison circuit comprises:

a coincidence detecting circuit detecting whether or not a column address outputted from said storage circuit coincides with said inputted column address to output a coincidence/non-coincidence signal on the basis of a result of the detection;

a first test mode circuit outputting a deactivating signal for deactivating said substitution column activating signal when receiving a activated first test mode, and outputting a coincidence/non-coincidence signal from said coincidence detecting circuit when receiving a deactivated first test mode; and a second test mode circuit outputting said activated substitution column activating signal on the basis of said column address when receiving an activated second test mode signal, and outputting said substitution column activating signal on the basis of said deactivating signal from said first test mode circuit or said coincidence/non-coincidence signal when receiving a deactivated second test mode signal.

6. The semiconductor memory device according to claim 5, wherein said coincidence detecting circuit is constituted of a first operational circuit performing an exclusive OR operation on a column address outputted from said storage circuit and said inputted column address, said first test mode circuit is constituted of a second operational circuit performing an AND operation on an output signal from said first operational circuit and an inverted signal of said first test mode, and said second test mode circuit is constituted of:
 a third operational circuit performing an AND operation on said column address and said second test mode signal: and
 a fourth operational circuit performing an OR operation on an output signal from said second operational circuit and an output signal from said third operational circuit.

* * * * *